(12) United States Patent
Wang et al.

(10) Patent No.: US 9,633,833 B2
(45) Date of Patent: Apr. 25, 2017

(54) METHODS AND APPARATUS FOR CLEANING SEMICONDUCTOR WAFERS

(71) Applicant: ACM Research (Shanghai) Inc., Shanghai (CN)

(72) Inventors: Jian Wang, Shanghai (CN); Sunny Voha Nuch, Shanghai (CN); Liangzhi Xie, Shanghai (CN); Junping Wu, Shanghai (CN); Zhaowei Jia, Shanghai (CN); Yunwen Huang, Shanghai (CN); Zhifeng Gao, Shanghai (CN); Yue Ma, Shanghai (CN); Hui Wang, Shanghai (CN)

(73) Assignee: ACM RESEARCH (SHANGHAI) INC. (CN)

( * ) Notice: Subject to any disclaimer, the term of this patent is extended or adjusted under 35 U.S.C. 154(b) by 0 days.

(21) Appl. No.: 15/282,298

(22) Filed: Sep. 30, 2016

(65) Prior Publication Data
US 2017/0032959 A1 Feb. 2, 2017

Related U.S. Application Data

(62) Division of application No. 13/262,264, filed as application No. PCT/CN2009/071088 on Mar. 31, 2009, now Pat. No. 9,492,852.

(51) Int. Cl.
*H01L 21/02* (2006.01)
*H01L 21/67* (2006.01)
*B08B 3/12* (2006.01)

(52) U.S. Cl.
CPC .......... *H01L 21/02068* (2013.01); *B08B 3/12* (2013.01); *H01L 21/67051* (2013.01)

(58) Field of Classification Search
CPC H01L 21/67051; H01L 21/02068; B08B 3/12
See application file for complete search history.

(56) References Cited

U.S. PATENT DOCUMENTS

| | | | | |
|---|---|---|---|---|
| 6,021,785 | A | * 2/2000 | Grutzediek | B08B 1/007 134/1.3 |
| 6,021,789 | A | * 2/2000 | Akatsu | B08B 3/12 134/184 |
| 2002/0029788 | A1 | * 3/2002 | Verhaverbeke | B08B 3/02 134/1.3 |
| 2002/0185164 | A1 | * 12/2002 | Tetsuka | H01L 21/67051 134/148 |
| 2003/0192570 | A1 | * 10/2003 | Thakur | B08B 3/024 134/1.3 |

(Continued)

*Primary Examiner* — Michael Barr
*Assistant Examiner* — Benjamin L Osterhout
(74) *Attorney, Agent, or Firm* — Miskin & Tsui-Yip LLP; Gloria Tsui-Yip, Esq.

(57) ABSTRACT

A method for cleaning semiconductor substrate using ultra/mega sonic device comprising holding a semiconductor substrate by using a chuck, positioning a ultra/mega sonic device adjacent to the semiconductor substrate, injecting chemical liquid on the semiconductor substrate and gap between the semiconductor substrate and the ultra/mega sonic device, changing gap between the semiconductor substrate and the ultra/mega sonic device for each rotation of the chuck during the cleaning process by turn the semiconductor substrate or the ultra/mega sonic device clockwise or counter clockwise.

14 Claims, 28 Drawing Sheets

(56) References Cited

U.S. PATENT DOCUMENTS

| | | | | |
|---|---|---|---|---|
| 2003/0192577 | A1* | 10/2003 | Thakur | B08B 3/024 134/146 |
| 2004/0007945 | A1* | 1/2004 | Gouk | B06B 1/0207 310/317 |
| 2004/0065540 | A1* | 4/2004 | Mayer | C23C 18/1619 204/198 |
| 2004/0132318 | A1* | 7/2004 | Kim | B08B 3/02 134/1 |
| 2004/0139985 | A1* | 7/2004 | Hegedus | B08B 3/02 134/1.3 |
| 2005/0252522 | A1* | 11/2005 | Struven | H01L 21/67057 134/1 |
| 2006/0151014 | A1* | 7/2006 | Obweger | H01L 21/67051 134/94.1 |
| 2006/0185696 | A1* | 8/2006 | Yamamoto | B08B 3/02 134/33 |
| 2006/0260642 | A1* | 11/2006 | Verhaverbeke | B08B 3/02 134/1.3 |

* cited by examiner

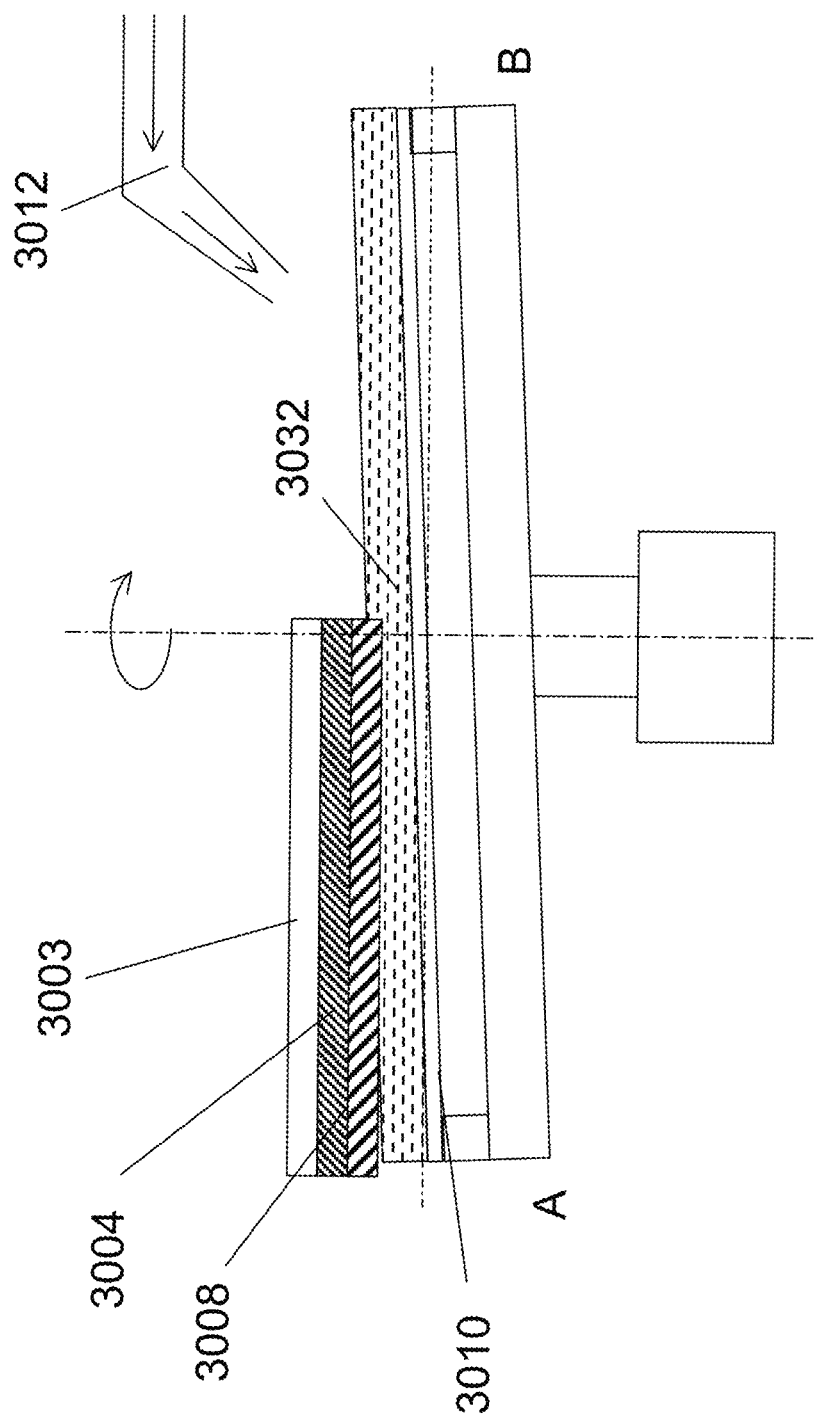

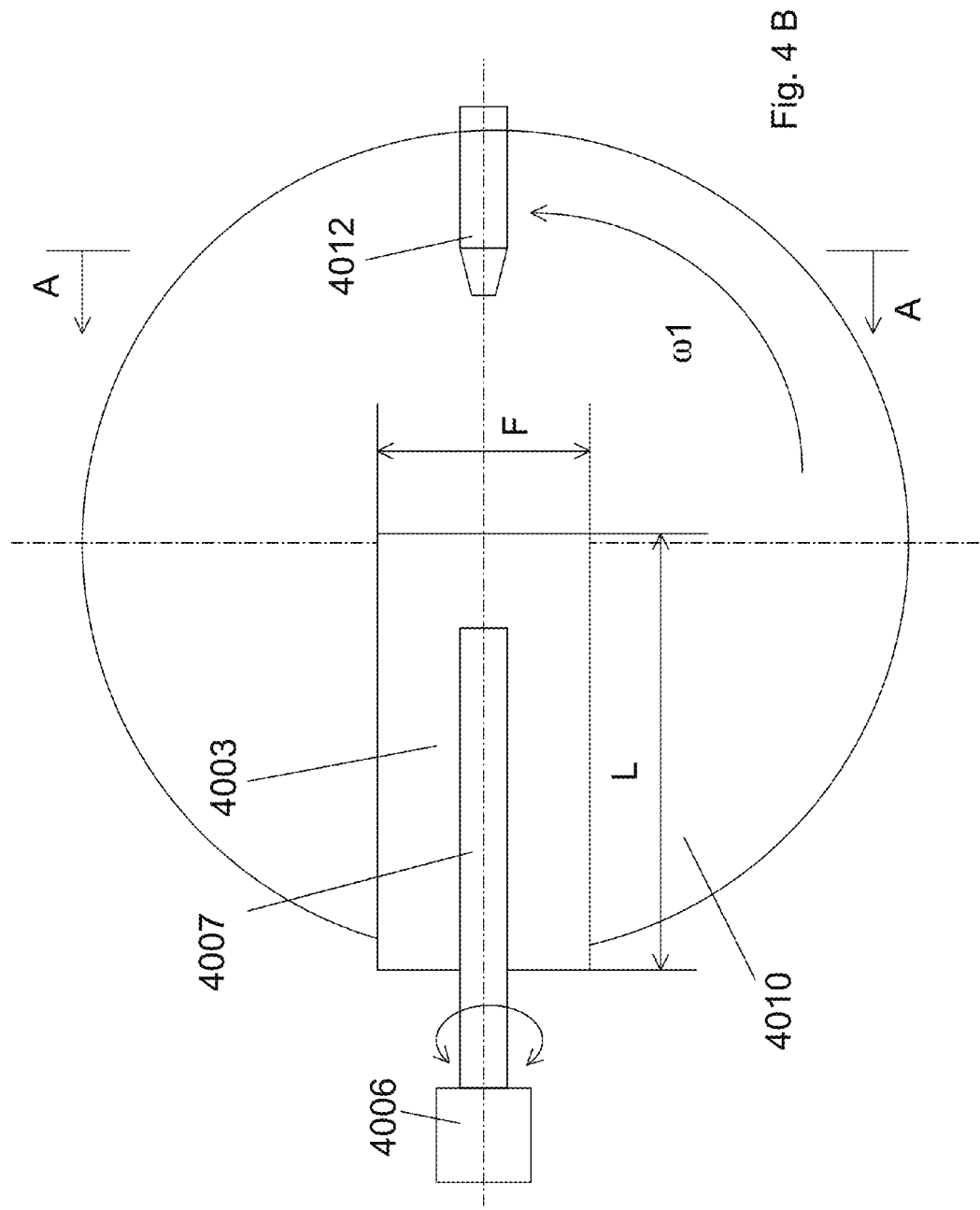

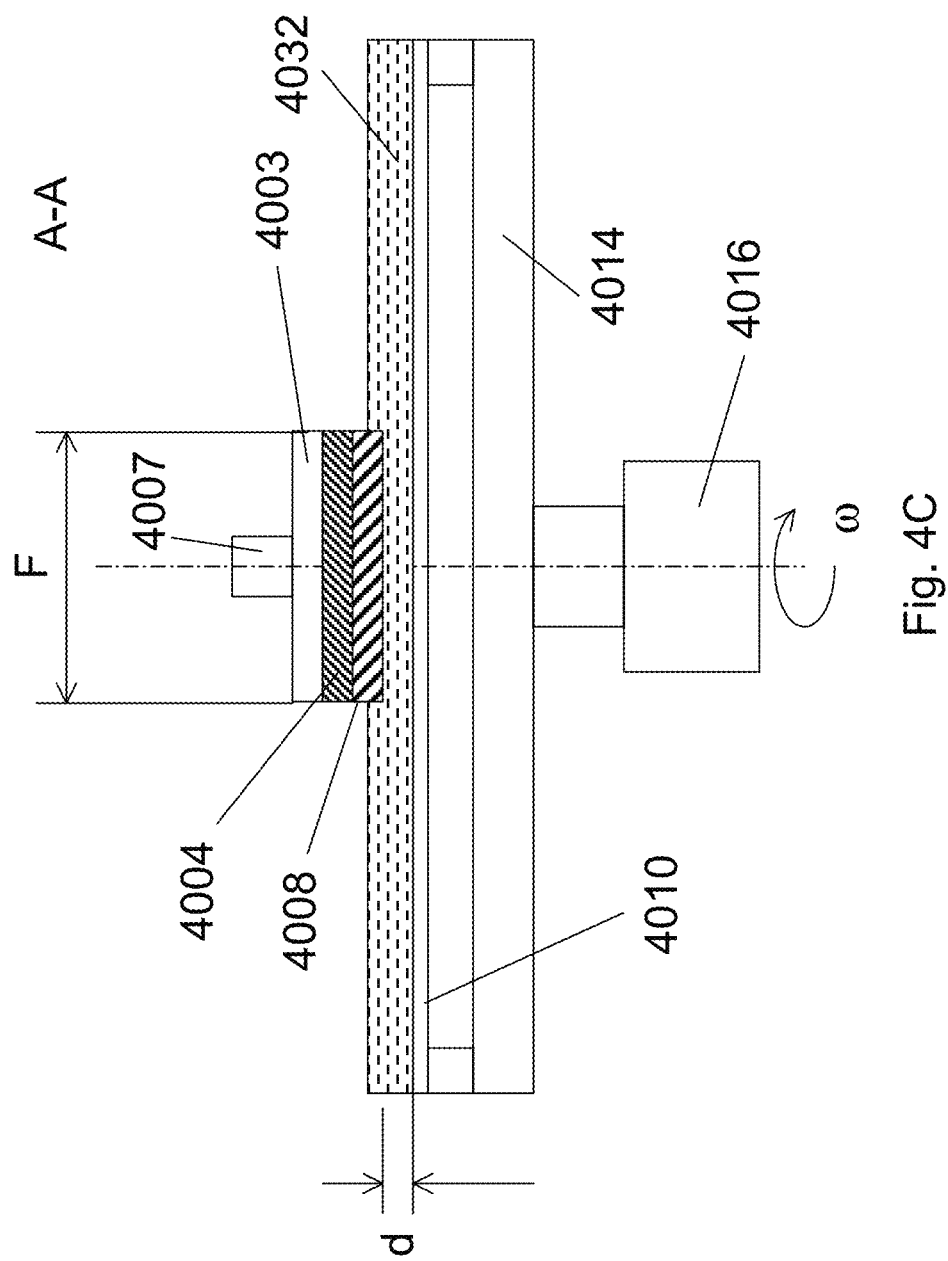

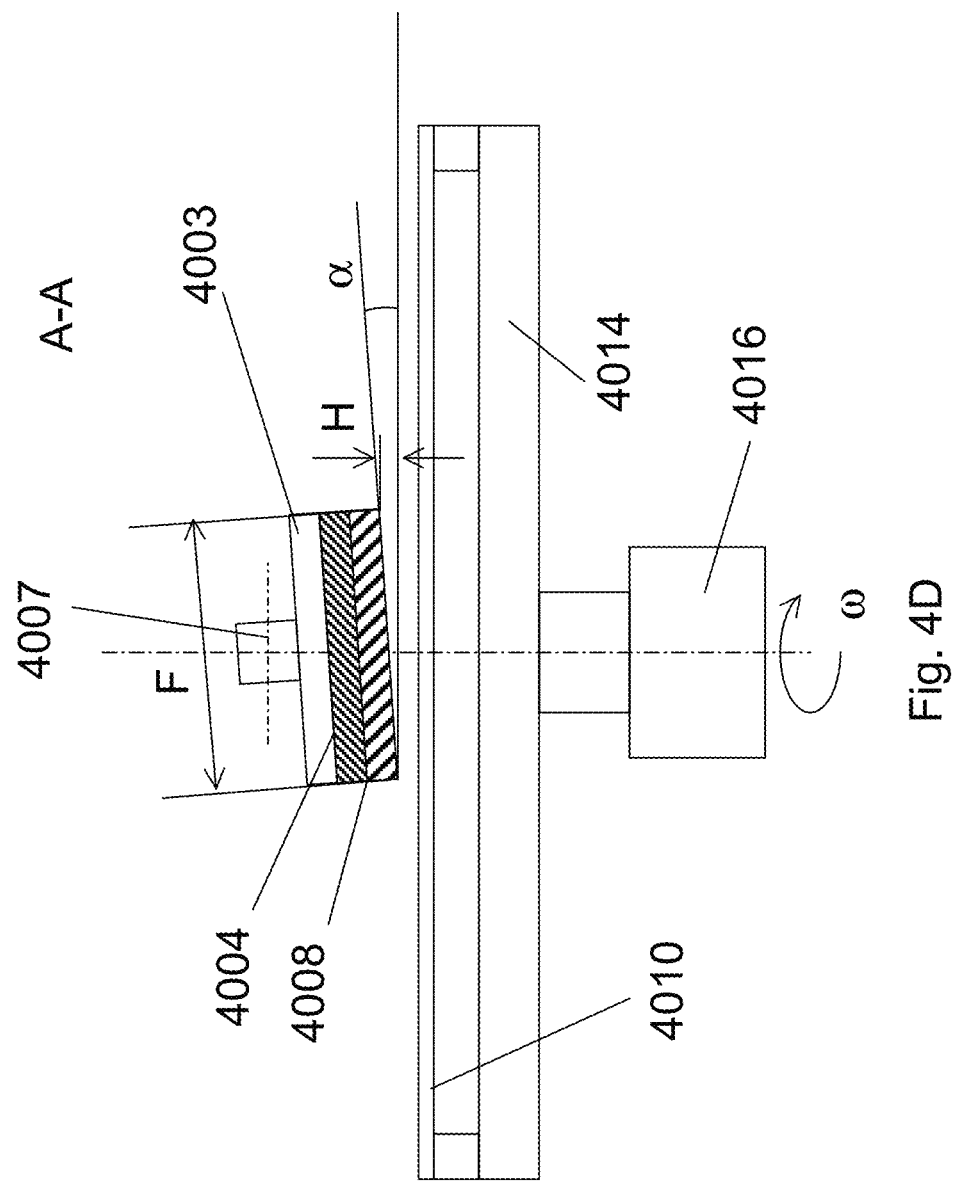

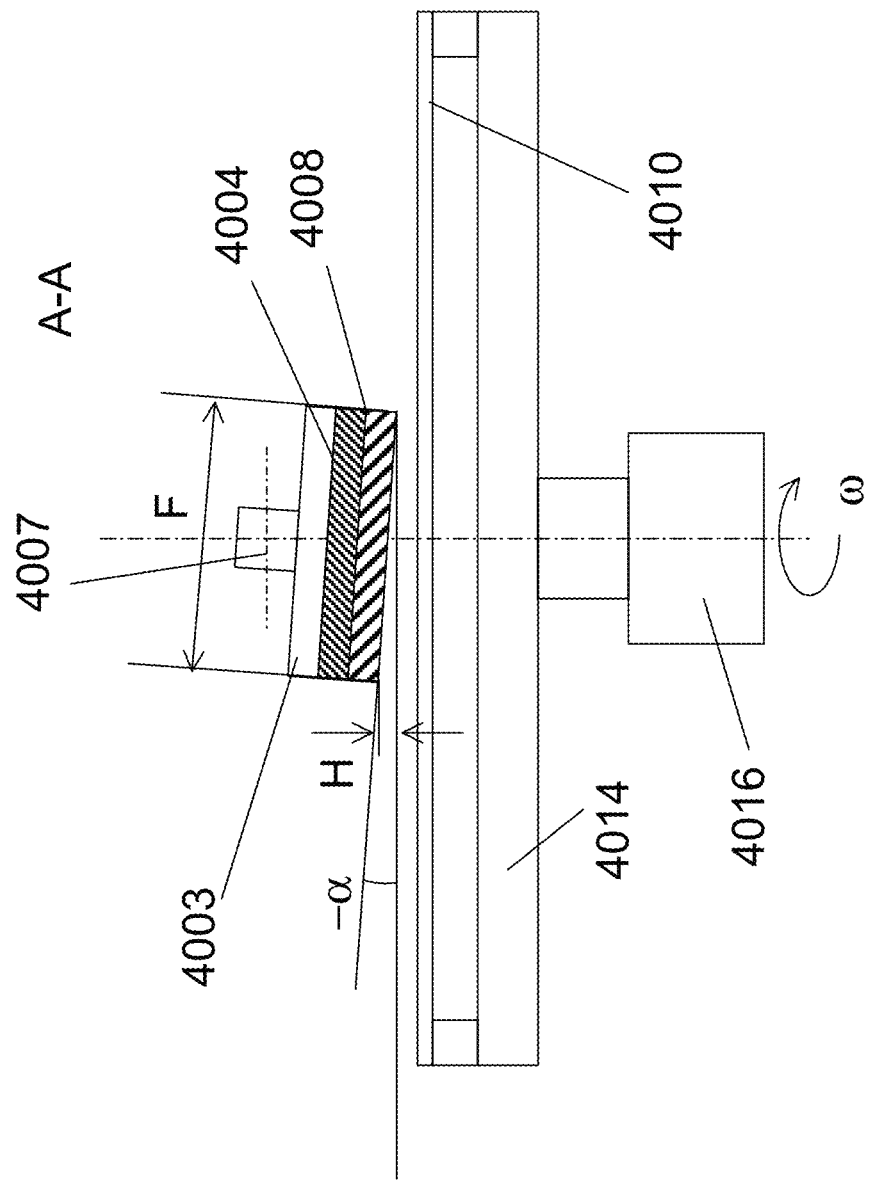

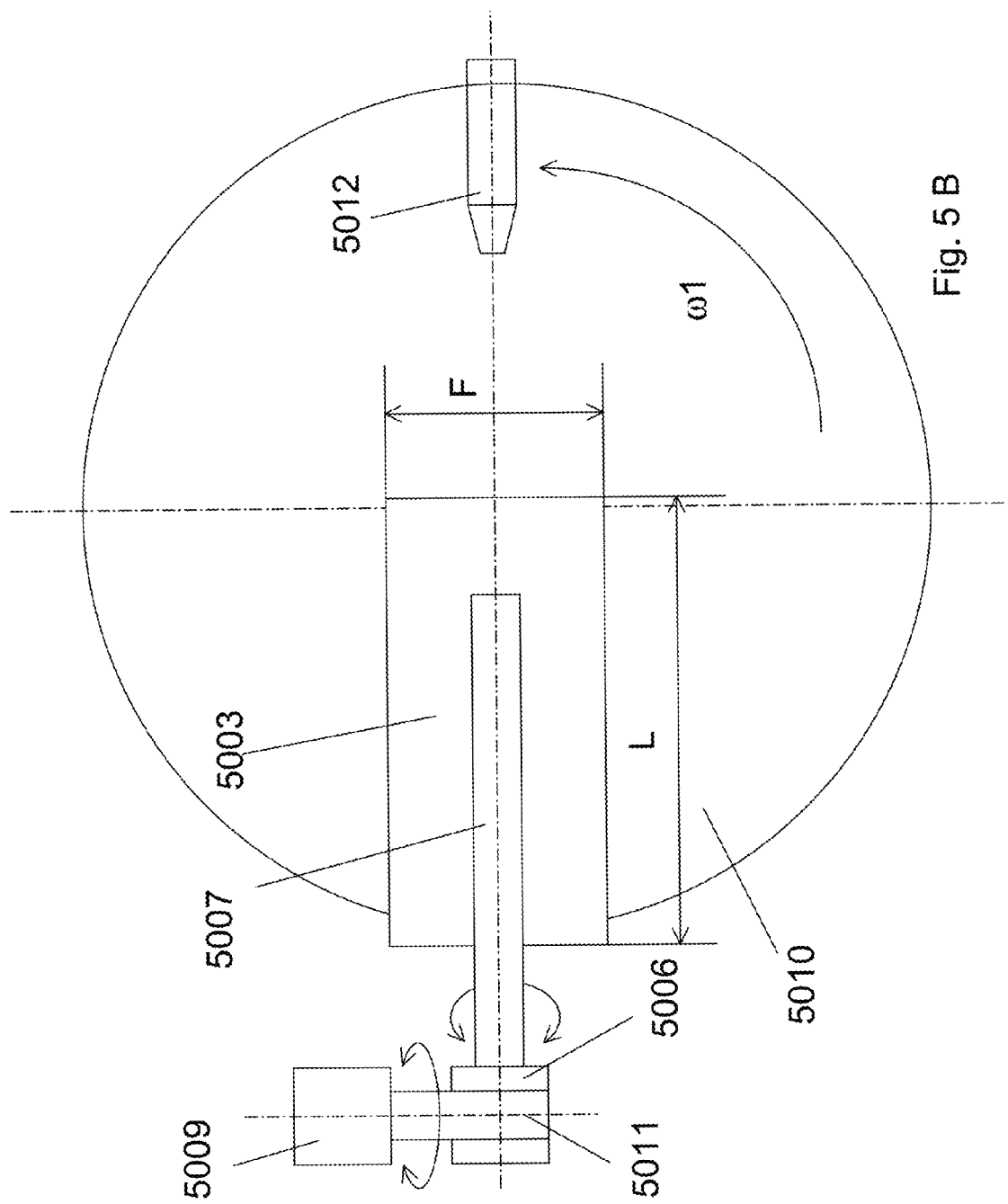

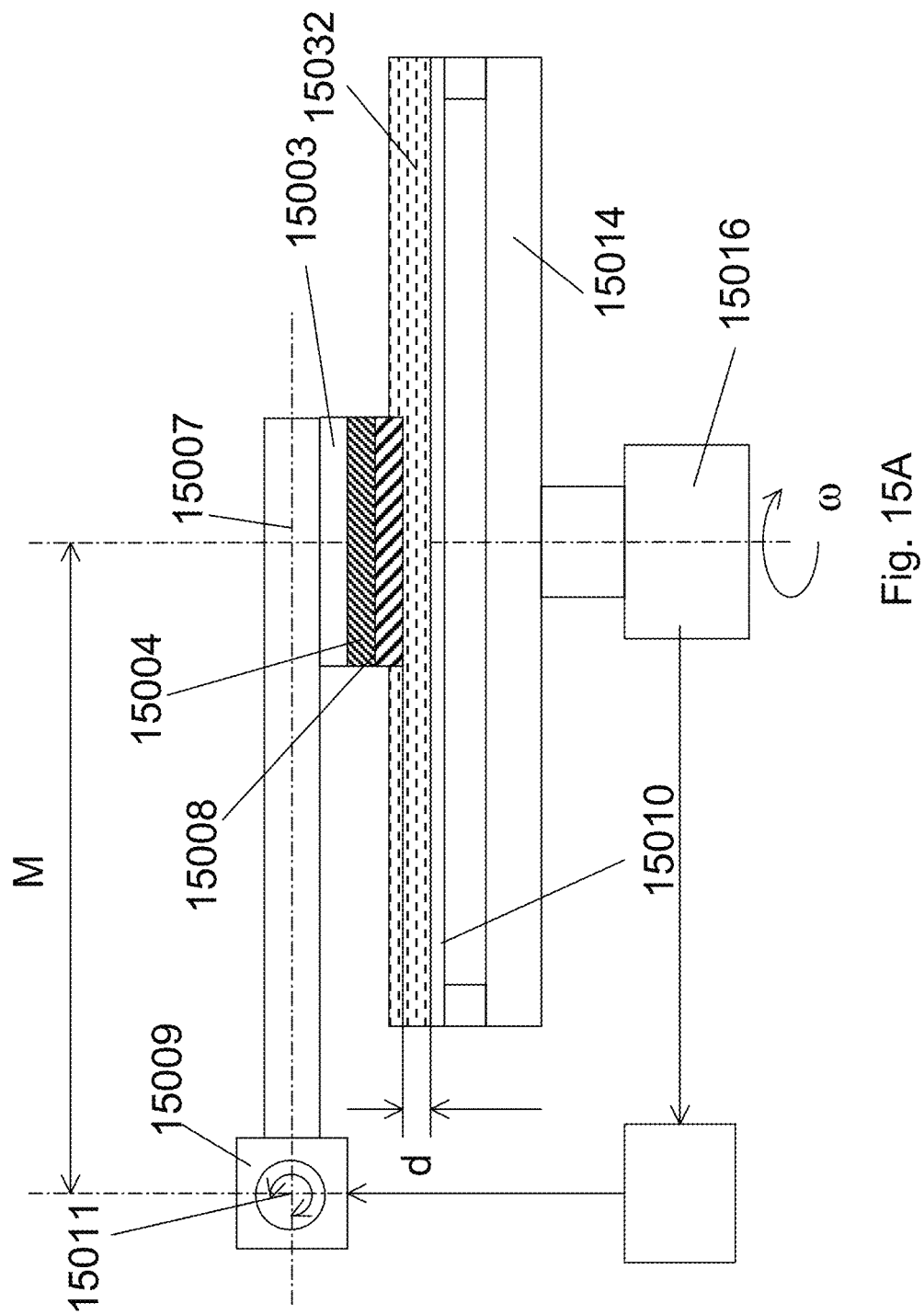

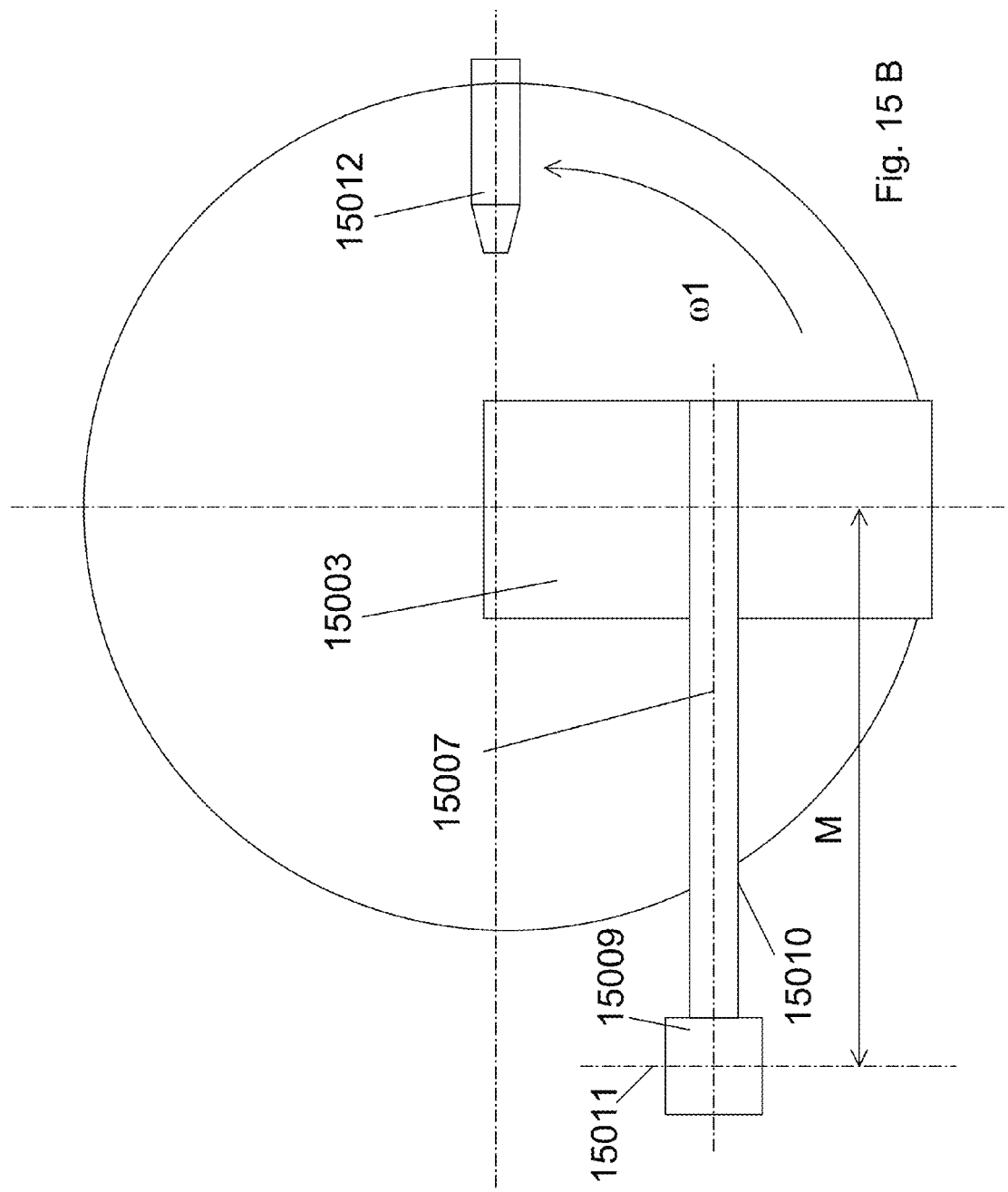

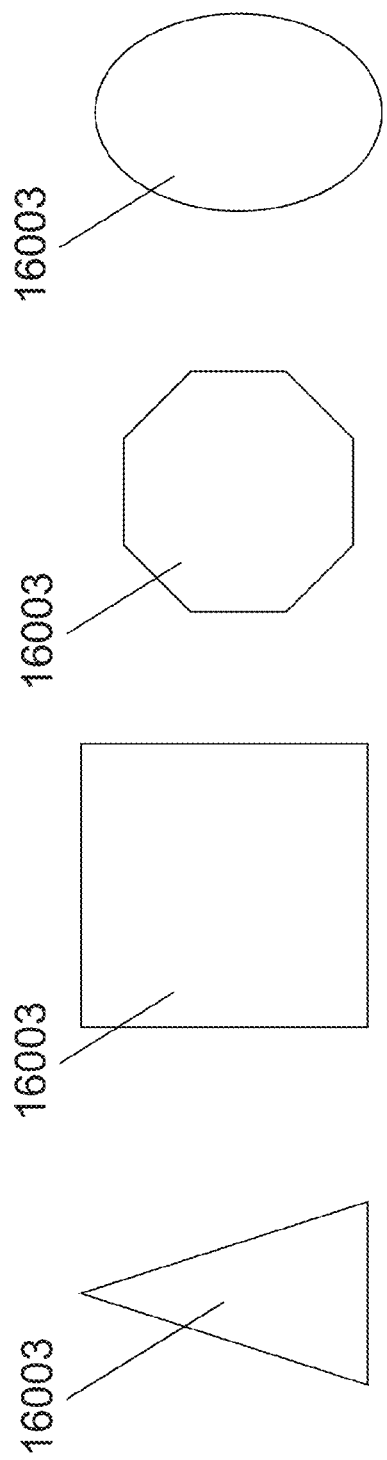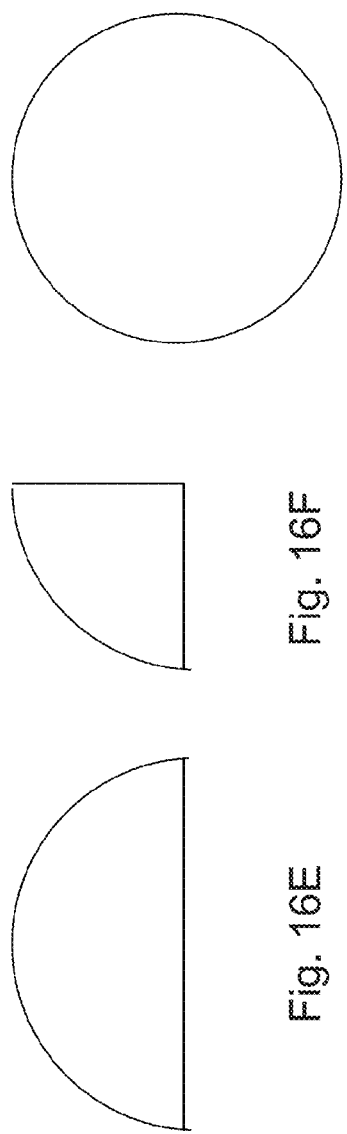
Fig. 16A Fig. 16B Fig. 16C Fig. 16D Fig. 16E Fig. 16F Fig. 16G

METHODS AND APPARATUS FOR CLEANING SEMICONDUCTOR WAFERS

FIELD OF THE INVENTION

The present invention generally relates to methods and apparatuses for cleaning semiconductor wafer. More particularly, relates to changing a gap between an ultra/mega sonic device and a wafer for each rotation of the wafer during the cleaning process to achieve an uniform ultra/mega sonic power density distribution on the wafer, which removes particles efficiently without damaging the device structure on the wafer.

BACKGROUND

Semiconductor devices are manufactured or fabricated on semiconductor wafers using a number of different processing steps to create transistor and interconnection elements. To electrically connect transistor terminals associated with the semiconductor wafer, conductive (e.g., metal) trenches, vias, and the like are formed in dielectric materials as part of the semiconductor device. The trenches and vias couple electrical signals and power between transistors, internal circuit of the semiconductor devices, and circuits external to the semiconductor device.

In forming the interconnection elements the semiconductor wafer may undergo, for example, masking, etching, and deposition processes to form the desired electronic circuitry of the semiconductor devices. In particular, multiple masking and plasma etching step can be performed to form a pattern of recessed areas in a dielectric layer on a semiconductor wafer that serve as trenches and vias for the interconnections. In order to removal particles and contaminations in trench and via post etching or photo resist ashing, a wet cleaning step is necessary. Especially, when device manufacture node migrating to 65 nm and beyond, the side wall loss in trench and via during is crucial for maintaining the critical dimension. In order to reduce or eliminating the side wall loss, it is important to use moderate, dilute chemicals, or sometime de-ionized water only. However, the dilute chemical or de-ionized water usually is not efficient to remove particle in the trench and via. Therefore the mechanical force such as ultra sonic or mega sonic is needed in order to remove those particles efficiently. Ultra sonic and mega sonic wave will apply mechanical force to wafer structure, the power intensity and power distribution is key parameters to control the mechanical force within the damage limit and at the same time efficiently to remove the particles.

Mega sonic energy coupled with nozzle to clean semiconductor wafer is disclosed in U.S. Pat. No. 4,326,553. The fluid is pressurized and mega sonic energy is applied to the fluid by a mega sonic transducer. The nozzle is shaped to provide a ribbon-like jet of cleaning fluid vibrating at mega sonic frequencies for the impingement on the surface.

A source of energy vibrates an elongated probe which transmits the acoustic energy into the fluid is disclosed in U.S. Pat. No. 6,039,059. In one arrangement, fluid is sprayed onto both sides of a wafer while a probe is positioned close to an upper side. In another arrangement, a short probe is positioned with its end surface close to the surface, and the probe is moved over the surface as wafer rotates.

A source of energy vibrates a rod which rotates around it axis parallel to wafer surface is disclosed in U.S. Pat. No. 6,843,257 B2. The rod surface is etched to curve groves, such as spiral groove.

To uniformly apply right amount of mega sonic power to entire wafer is critical for the cleaning process. If the mega sonic power is not uniformly applied on the wafer, the portion of wafer receiving less mega sonic power will not be cleaned well, and leaving particles and contamination on the portion of the wafer, and portion of wafer receiving extra mega sonic power may cause the damage of device structure on the wafer due high pressure and high temperature micro jet generated by implosion of bubbles.

It is needed to have a better method for controlling the mega sonic power density distribution on the wafer to clean particles and contamination on surface of wafer or substrate with higher efficiency and lower structure damages.

SUMMARY

One embodiment of the present invention is to put a mega sonic device adjacent to front side of a rotating wafer during the cleaning process, and to change the gap between the mega sonic device and the wafer for each rotation of the wafer. The gap between mega sonic device and the wafer is changed by turning mega sonic device clockwise and/or counter clockwise around an axis parallel to the front side of the wafer.

Another embodiment of the present invention is to put a mega sonic device adjacent to front side of a rotating wafer during the cleaning process, and to change the gap between the mega sonic device and the wafer for each rotation of the wafer. The gap between mega sonic device and the wafer is changed by turning the wafer surface clockwise and/or counter clockwise around an axis parallel to the surface of the mega sonic device.

Another embodiment of the present invention is to put a mega sonic device adjacent to back side of a rotating wafer, and to change the gap between the mega sonic device and the wafer for each rotation of the wafer during the cleaning process. The gap between mega sonic device and the wafer is changed by turning mega sonic device clockwise and/or counter clockwise around an axis parallel to the backside of the wafer.

Another embodiment of the present invention is to put a mega sonic device adjacent to back side of a rotating wafer, and to change the gap between the mega sonic device and the wafer for each rotation of the wafer during the cleaning process. The gap between mega sonic device and the wafer is changed by turning the wafer surface clockwise and/or counter clockwise around an axis parallel to the surface of the mega sonic device.

BRIEF DESCRIPTION OF THE DRAWINGS

FIGS. 3A-3B depicts another exemplary wafer cleaning apparatus;

FIG. 4A-4E depict another exemplary wafer cleaning apparatus;

FIG. 5A-5C depict further another exemplary wafer cleaning apparatus;

FIGS. 15A-15C show another embodiment of wafer cleaning apparatus using a mega sonic device according to the present invention.

FIGS. 16A-16G depict variety of shape of ultra/mega sonic transducers.

DETAILED DESCRIPTION

Figure 1A:
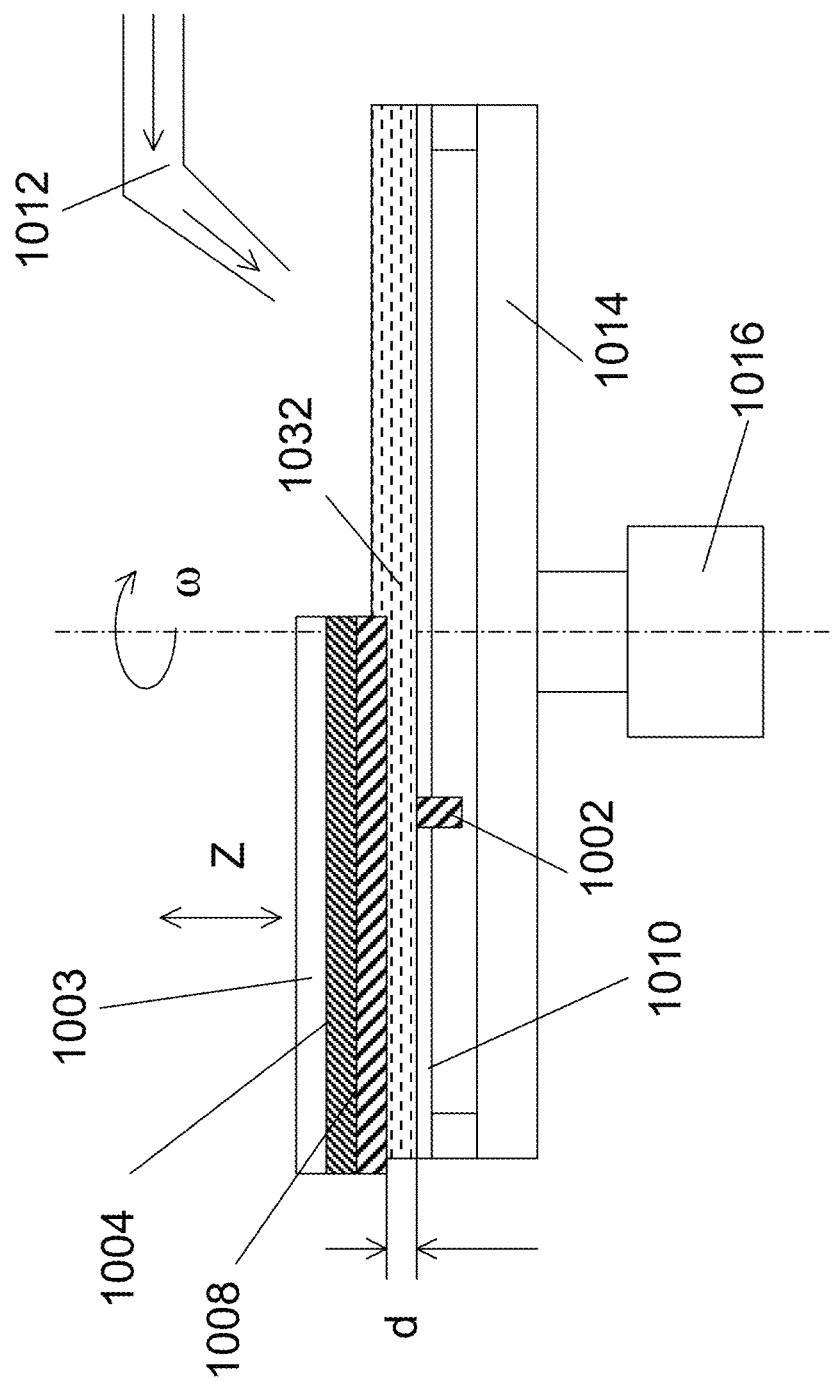
FIGS. 1A-1D depict an exemplary wafer cleaning apparatus.
Figure 1B:
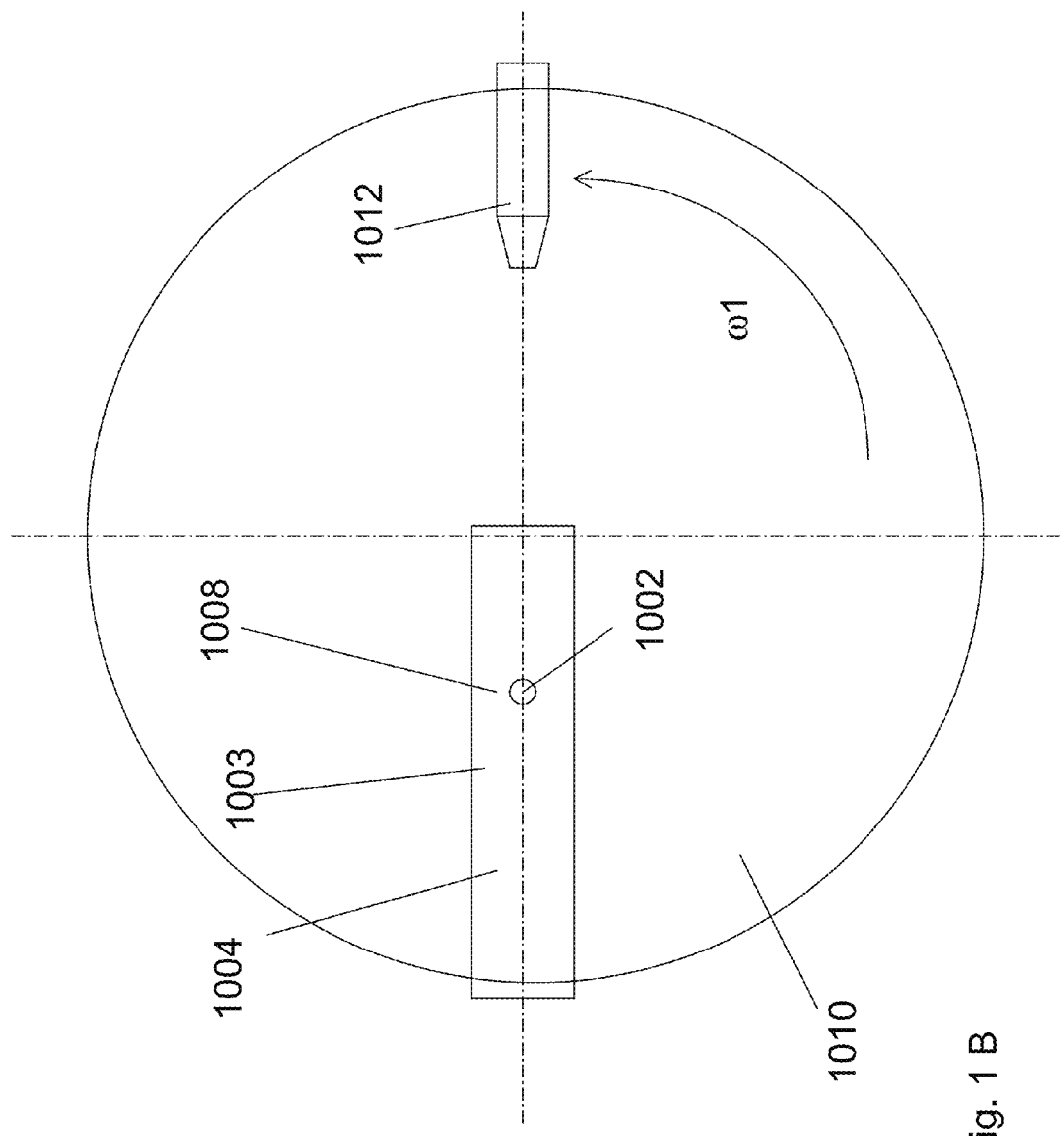

FIGS. 1A to 1B show the conventional wafer cleaning apparatus using a mega sonic device. The wafer cleaning apparatus consists of wafer 1010, wafer chuck 1014 being rotated by rotation driving mechanism 1016, nozzle 1012 delivering cleaning chemicals or de-ionized water 1032, and mega sonic device 1003. The mega sonic device 1003 further consists of piezoelectric transducer 1004 acoustically coupled to resonator 1008. Transducer 1004 is electrically excited such that it vibrates and the resonator 1008 transmits high frequency sound energy into liquid. The agitation of the cleaning liquid produced by the mega sonic energy loosens particles on wafer 1010. Contaminants are thus vibrated away from the surfaces of the wafer 1010, and removed from the surfaces through the flowing liquid 1032 supplied by nozzle 1012.

Figure 1C:
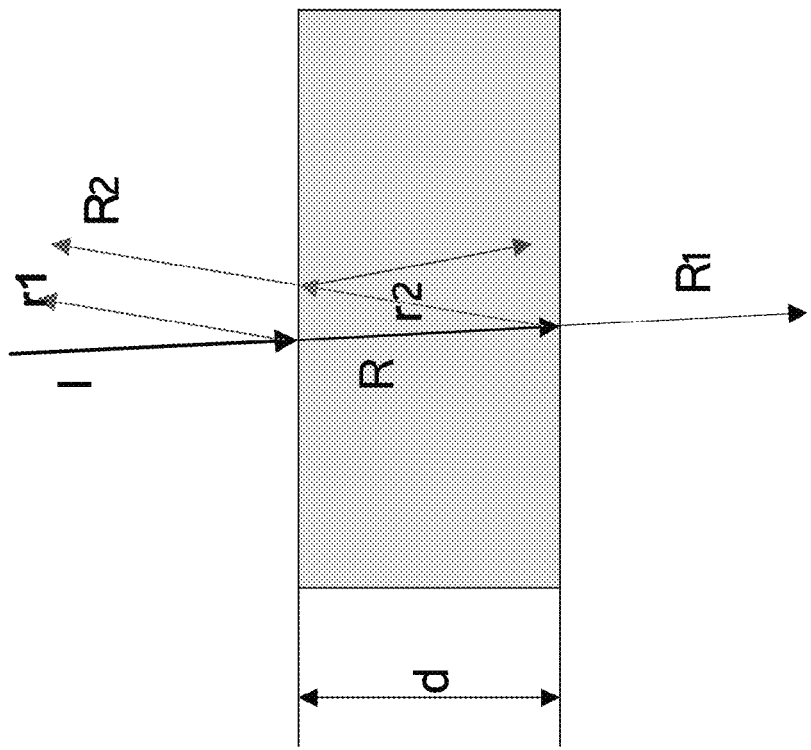

As shown in FIG. 1C, in order to achieve the least reflection energy, the phase reflection wave r1 (from top of water film) must be opposite to reflection R2 (bottom of water film), therefore water film thickness must equal to:

$$d = n\lambda/2, n = 1, 2, 3, \quad (1)$$

Where, d is the thickness of water film or gap between mega-sonic device 1003 and wafer 1010, n is an integer number, and λ is wavelength of mega sonic wave in water. For example, for mega sonic frequency of 937.5 K Hz, λ=1.6 mm, the d=0.8 mm, 1.6 mm, 2.4 mm, and so on.

Figure 1D:
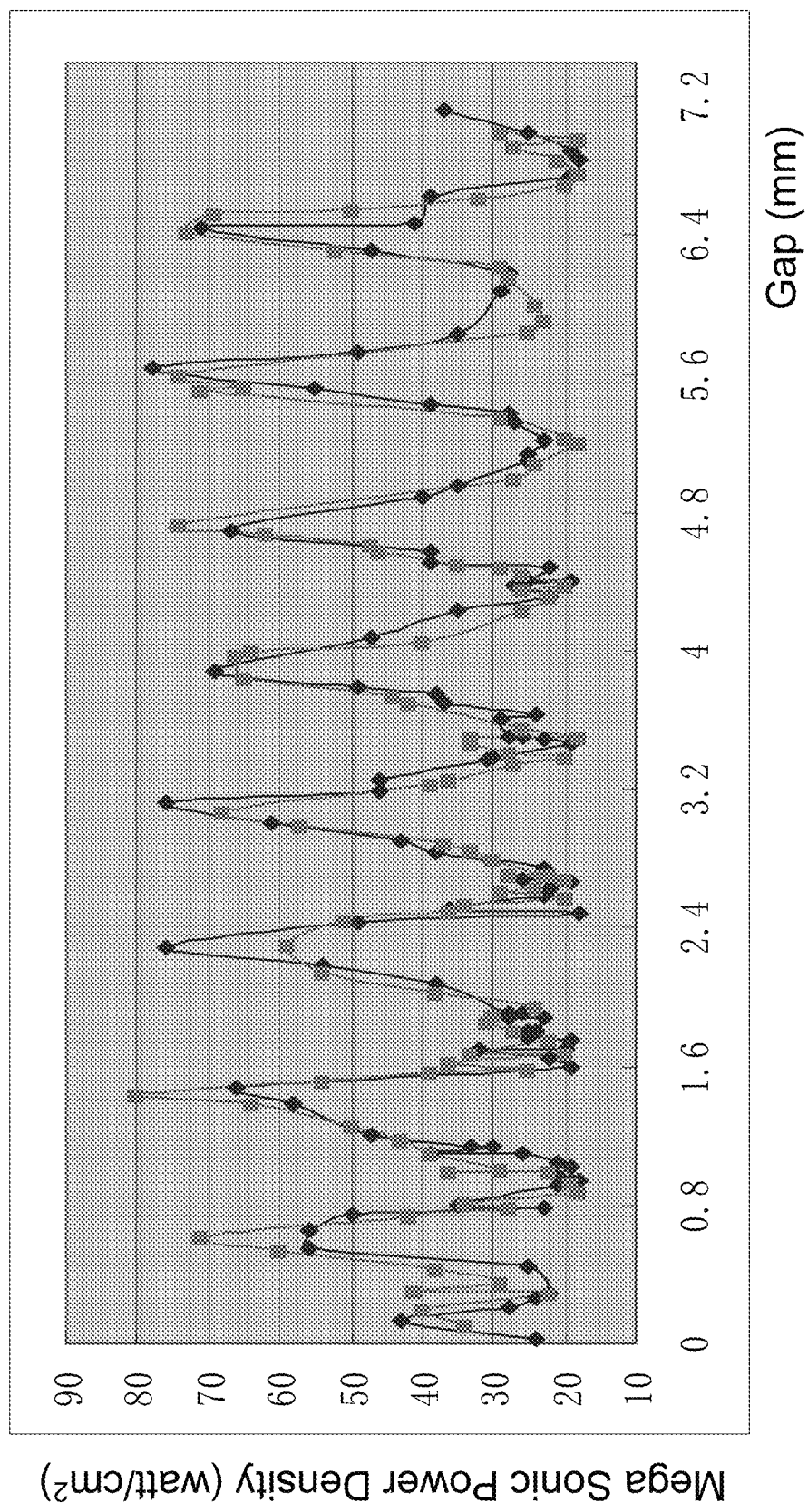

FIG. 1D shows the relationship between gap d and mega sonic power density measured by sensor 1002 as shown in FIG. 1A. Power density is varies from valley value 20 w/cm2 to peak value 80 w/cm2 as gap size increase 0.4 mm, and reach a full cycle in the gap increment of 0.8 mm (0.5λ). It is critical to maintain a gap precisely in order to keep a uniform mega sonic power distribution on the entire wafer.

Figure 2:
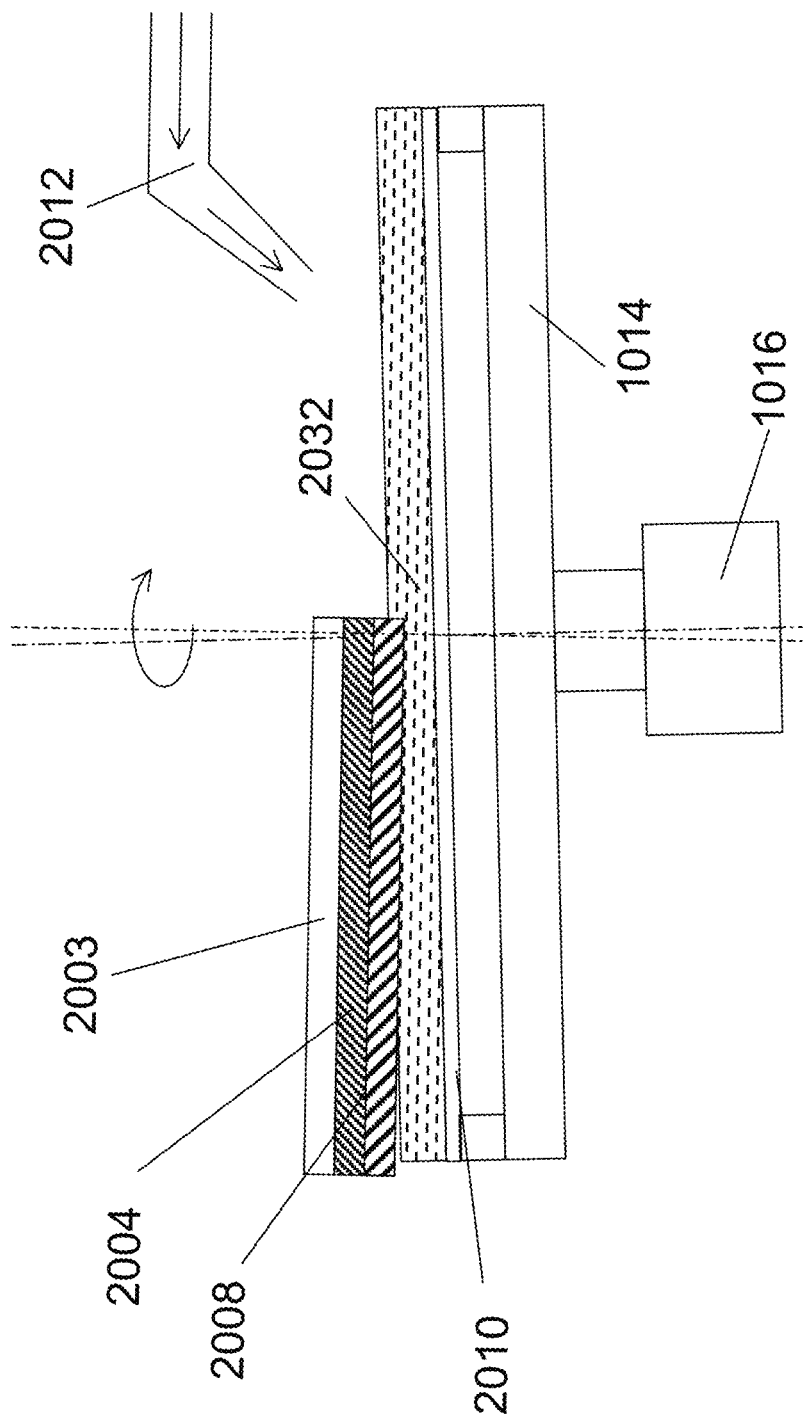
FIG. 2 depicts an exemplary wafer cleaning process.

However it is very difficult to keep a uniform gap in such precision in the reality, especially when the wafer is rotation mode. As shown in FIG. 2, if wafer chuck 1014 is set not 100% vertical to surface of mega sonic device 2003, the gap between mega sonic device and surface of wafer 2010 is reducing from edge of the wafer to center of the wafer. It will cause non uniform mega sonic power density distribution from edge of the wafer to center of the wafer according to data shown in FIG. 1D.

Figure 3B:
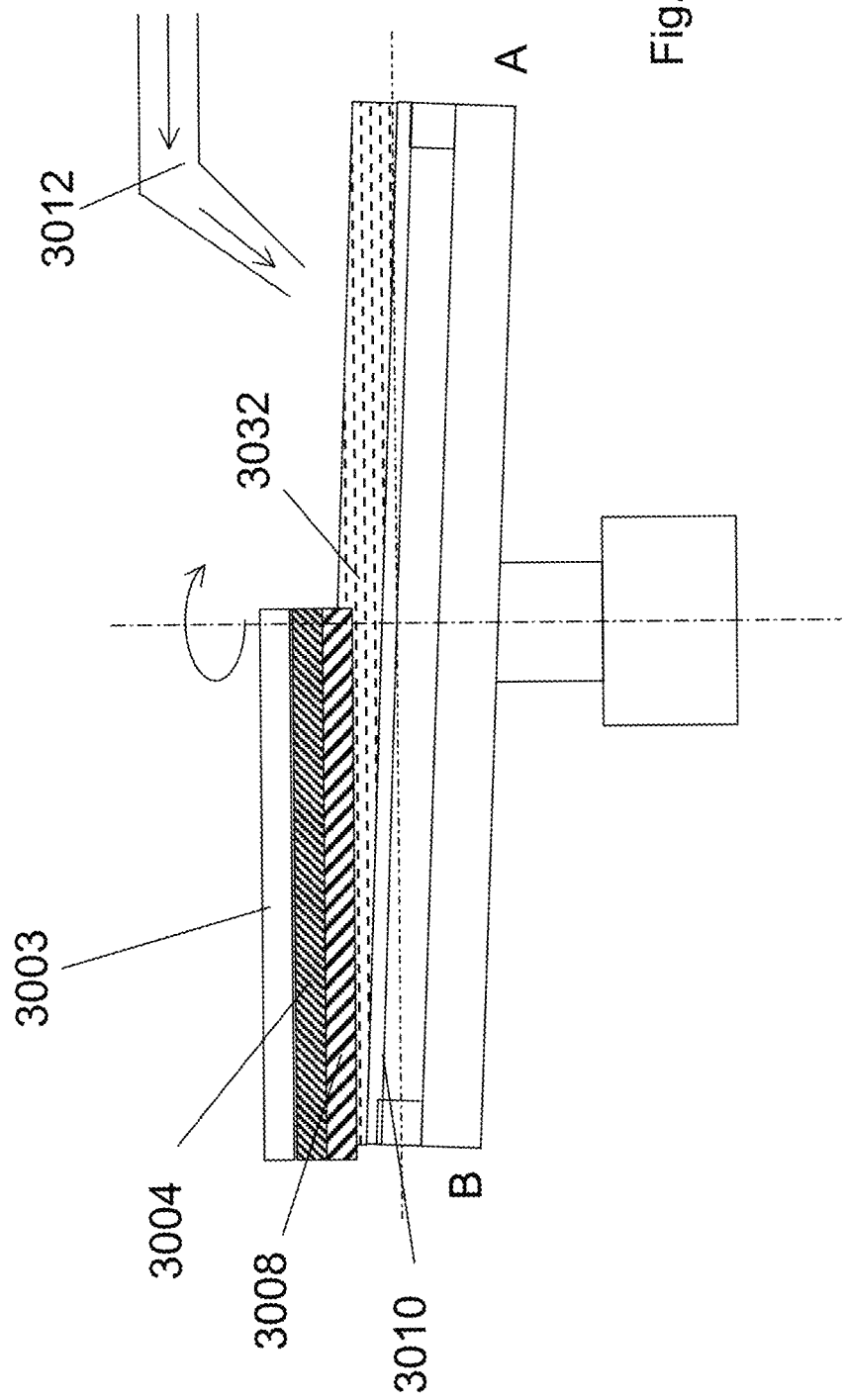
Figure 4A:
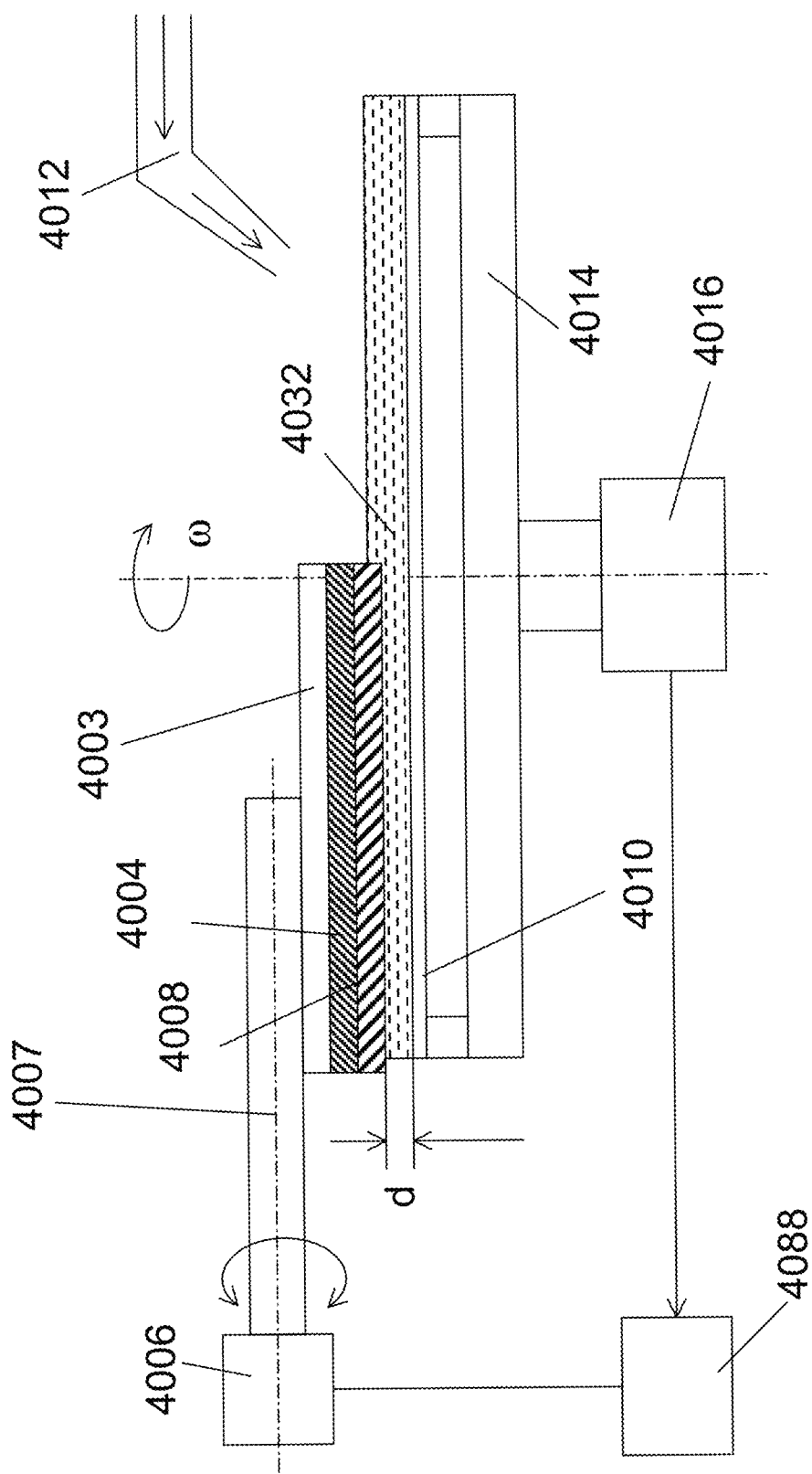

Another possible gap variation is caused by rotation axis of chuck being not veridical to surface of wafer 3010 as shown in FIGS. 3A and 3B. The wafer is wobbling when rotating, and FIG. 3B shows gap status after rotating 180 degree from status as shown in FIG. 3A. The gap at edge of wafer reduces from a biggest value as shown in FIG. 3A to smallest value as shown in FIG. 3B. It will cause non uniform mega sonic power density distribution on wafer as wafer passing mega sonic device. All such non uniform power distribution will either cause damage to device structure on the wafer and no uniformly cleaning wafer.

In order to overcome non uniform power distribution caused by variation of gap during chuck rotation, the present invention discloses a method as shown in FIGS. 4A to 4E. The gap between mega sonic device 4003 and wafer 4010 is changed by motor 4006 as chuck 4014 rotating during cleaning process. Control unit 4088 is used to control the speed of motor 4006 based on speed of motor 4016. For each rotation of wafer 4010 or chuck 4014, control unit 4088 instructs motor 4006 to turn mega sonic device 4003 clockwise and/or counter clockwise around axis 4007. The increment of rotation angle of motor 4006 for each rotation of wafer 4010 or chuck 4014 is, $$\Delta\alpha = 0.5\lambda/(FN) \quad (2)$$

Where, F is width of mega sonic device 4003, λ is wavelength of ultra/mega sonic wave, and N is an integer number between 2 to 1000.

After chuck 4014 rotating N rotations, mega sonic device 4003 turns up to total angle of 0.5nλ/F, where n is an integer number starting from 1.

Figure 6:
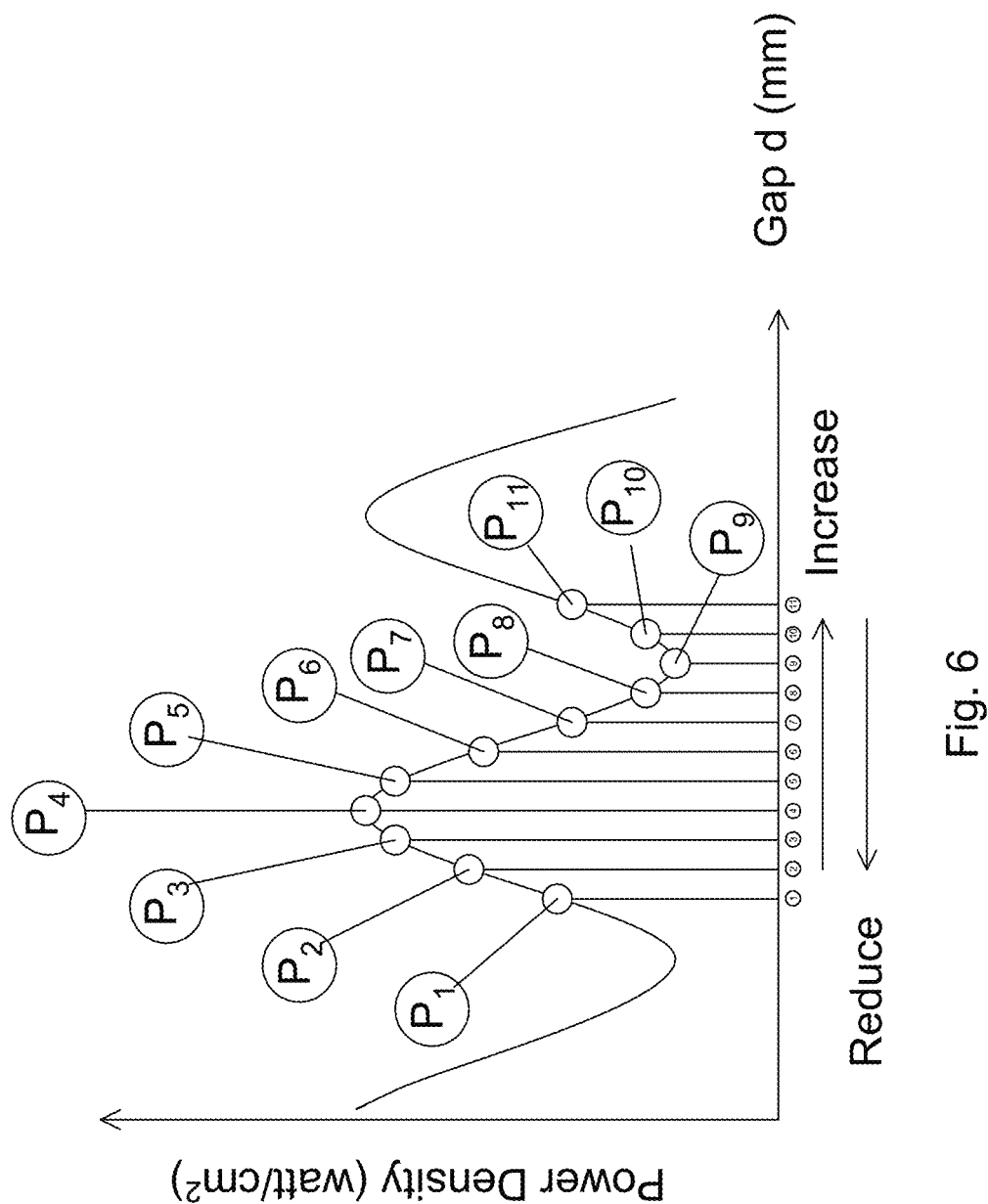
FIG. 6 depicts a cleaning method.

As shown further in detail in FIG. 6, when the gap changes for each rotation of wafer or chuck, the mega sonic power density at the same portion of wafer changes from P1 to P2. When the gap increases total half wavelength of mega sonic wave, the power density varies a full cycle from P1 to P11. The cycle starting point depends on the gap between mega sonic device and portion of wafer, however each portion on wafer will receive full cycle of power density when gap increases half wavelength of mega sonic wave. In other words, even gap between mega sonic device and wafer is not set uniformly due to reason described in FIG. 2, FIGS. 3A and 3B, each portion of the wafer will receive full cycle of mega sonic power when mega sonic device moves up half wavelength of mega sonic wave (about 0.8 mm for frequency of 937.5 kHz). This will guarantee each location of wafer to receive the same mount of mega sonic power density including the same average power density, the same maximum power density, and the same minimum power density. The operation sequence can be set as follows:

Process Sequence 1 (mega sonic frequency: f=937.5 kHz, and wavelength in deionized water=λ=1.6 mm):

Step 1: rotating wafer at speed of w, and w is in the range of 10 rpm to 1500 rpm.

Step 2: move mega sonic device to adjacent to wafer with gap d, and d is in the range of 0.5 to 5 mm.

Step 3: turn on nozzle with deionized (DI) water or chemicals, and turn the mega sonic device on. The power density of mega sonic device is in the range of 0.1 to 1.2 watt/cm², and preferred in the range of 0.3 to 0.5 watt/cm².

Step 4: for each rotation of chuck 4014, turn mega sonic device 4003 clockwise an angle of 0.5λ/(FN), where N is an integer number and in the range of 2 to 1000.

Step 5: continue step 4 until mega sonic device 4003 turns clockwise up to total angle of 0.5nλ/F, where n is an integer number starting from 1.

Step 6: for each rotation of chuck 4014, turn mega sonic device 4003 counter clockwise an angle of 0.5λ/(FN), where N is an integer number and in the range of 2 to 1000.

Step 7: continue step 6 until mega sonic device 4003 turns counter clockwise up to total angle of 0.5nλ/F, where, n is an integer number starting form 1.

Step 8: repeat step 4 to step 7 until wafer is cleaned.

Step 9: turn off mega sonic devices, stop the DI water or chemicals, and then dry the wafer.

Process Sequence 2 (mega sonic frequency: f=937.5 kHz, and wavelength in deionized water=λ=1.6 mm):

Step 1: rotating wafer at speed of ω, and ω is in the range of 10 rpm to 1500 rpm.

Step 2: move mega sonic device to adjacent to wafer with gap d, and d is in the range of 0.5 to 5 mm.

Step 3: turn on nozzle with deionized (DI) water or chemicals, and turn the mega sonic device on. The power density of mega sonic device is in the range of 0.1 to 1.2 watt/cm$^2$, and preferred in the range of 0.3 to 0.5 watt/cm$^2$.

Step 4: for each rotation of chuck, turn mega sonic device clockwise an angle of 0.5λ/(FN), where N is an integer number and in the range of 2 to 1000.

Step 5: continue step 4 until mega sonic device turns clockwise up to total 0.5nλ/F, where n is an integer number starting form 1.

Step 6: turn off mega sonic devices, stop the DI water or chemicals, and then dry the wafer.

The frequency of transducer can be set at ultra sonic range and mega sonic range, depending on the particle to be cleaned. The larger the particle size is, the lower frequency should be used. Ultra sonic range is between 20 kHz to 200 kHz, and mega sonic range is between 200 kHz to 10 MHz. Also frequency of mechanical wave can be alternated either one at a time in succession or concurrently in order to clean different size of particles on the same substrate or wafer. If a dual frequency of waves are used, the higher frequency $f_1$ should be multiple integer number of lower frequency $f_2$, and the transducer rotating angle range should be the 0.5$λ_2$ n/F, increment or reduction of angle of transducer for each rotation of chuck should be 0.5□$λ_1$/(FN), which $λ_2$ is wavelength of the wave with the lower frequency $f_2$, $λ_1$ is wavelength of the wave with the higher frequency $f_1$, and N is an integer number between 2 to 1000, and n is an integer number starting from 1.

One example of chemicals being used to remove the particle and contamination are shown as follows:

Organic Material Removal: $H_2SO_4$:$H_2O_2$=4:1
Organic Material Removal: Ozone:$H_2O$=50:1000,000
Particle Reduction: $NH_4OH$:$H_2O_2$:$H_2O$=1:1:5
Metal Contamination Removal: HCl:$H_2O_2$:$H_2O$=1:1:6
Oxide Removal: Oxide Removal=HF:$H_2O$=1:100

Figure 5A:
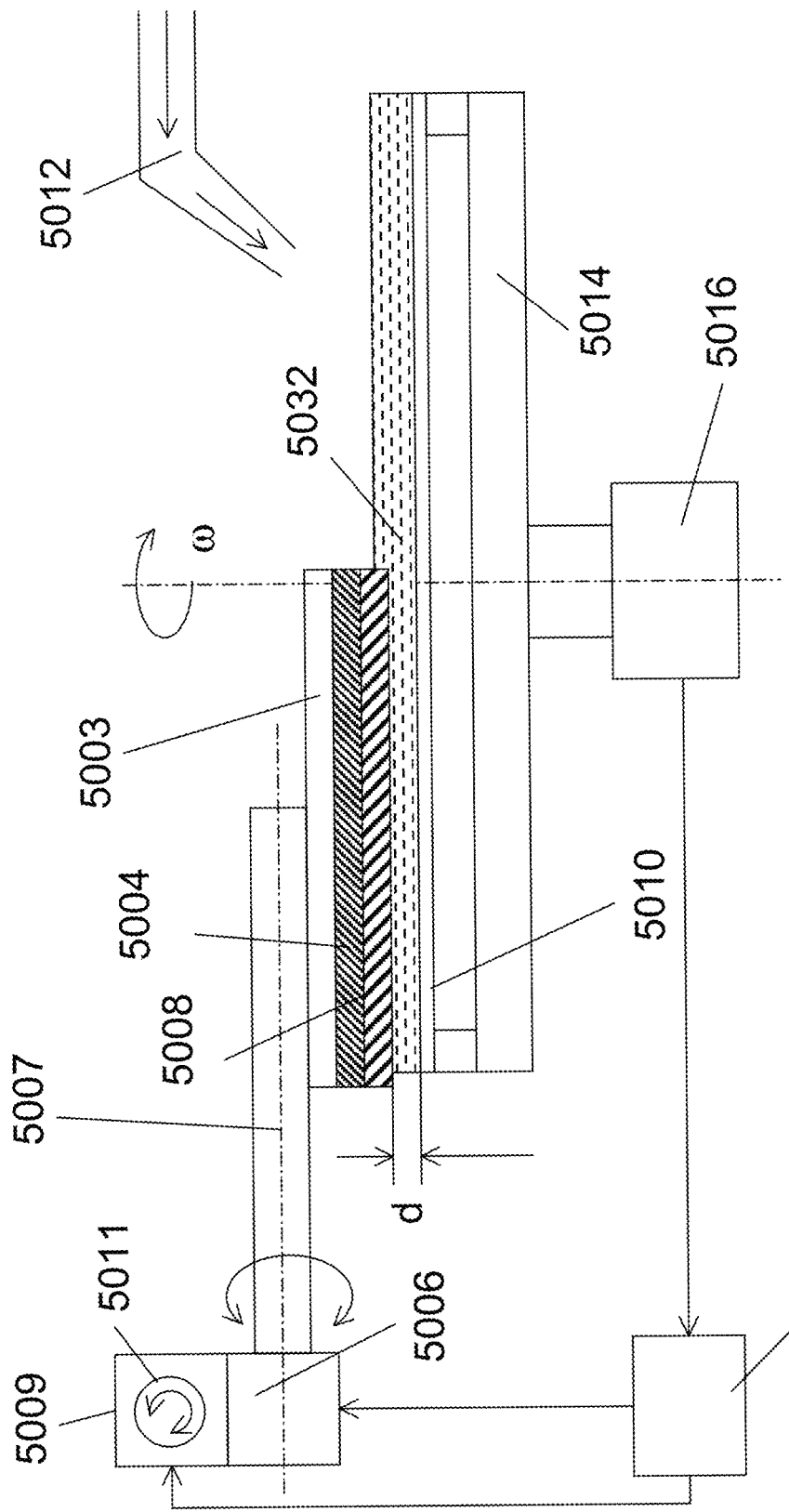
Figure 5C:
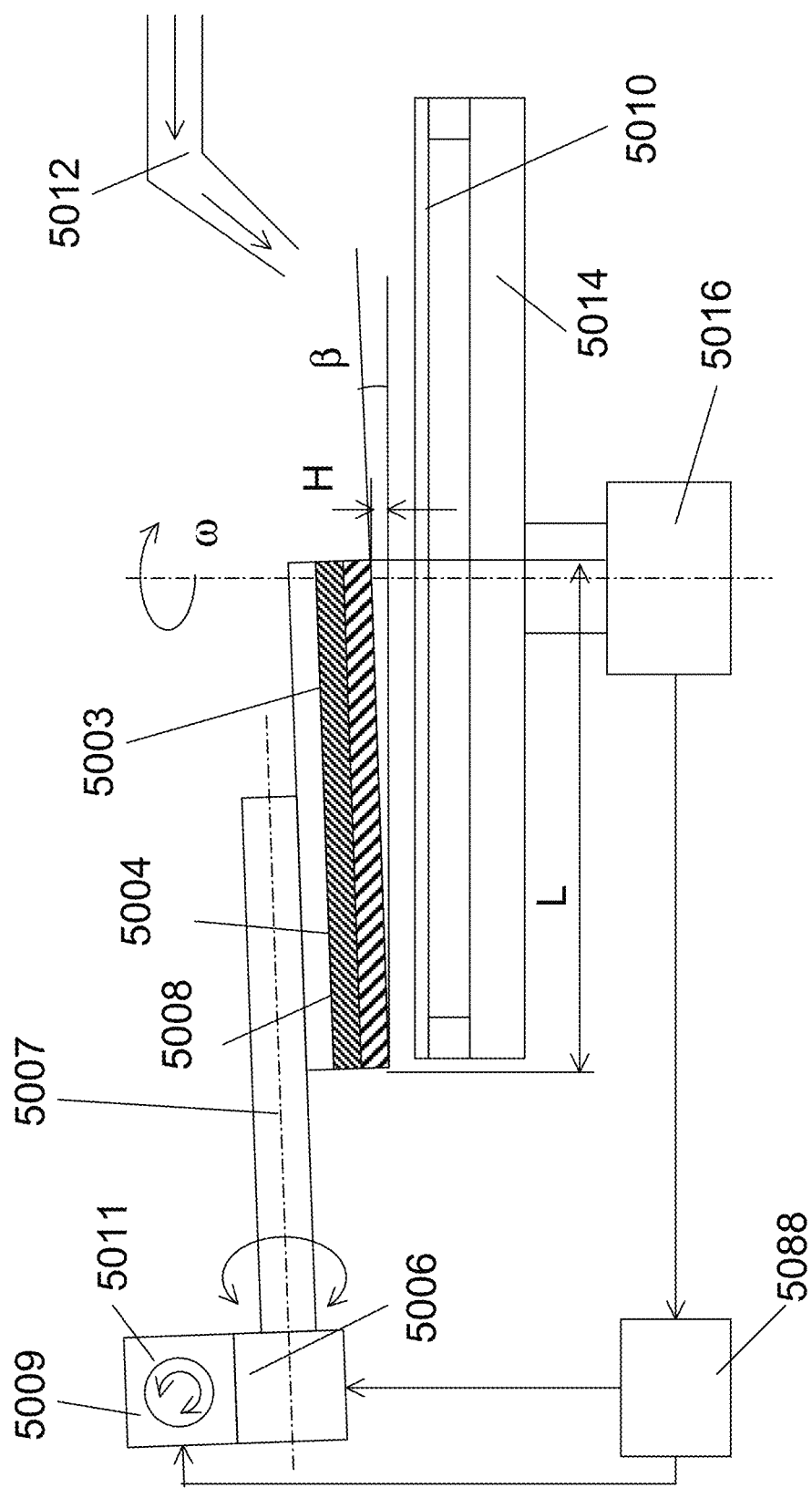

FIG. 5A to 5C show another embodiment of wafer cleaning apparatus using a mega sonic device according to the present invention. The embodiment is similar to that shown in FIG. 4, except that additional rotating mechanism 5009 is added. Control unit 5088 changes the gap d between mega sonic device 5003 and wafer 5010 by instructing motor 5006 and motor 5009 for each rotation of wafer 5010 or chuck 5014. For each rotation of wafer 5010 or chuck 5014, control unit 5088 instructs motor 5006 to turn mega sonic device 5003 clockwise and/or counter clockwise around axis 4007, and at the same time instructs motor 5009 to turn mega sonic device 5003 clockwise and/or counter clockwise around axis 5011. The rotation angle increment of motor 5006 for each rotation of wafer 5010 or chuck 5014 is, $$\Delta\alpha=0.5\lambda/(FN) \quad (3)$$

Where, F is width of mega sonic device 5003, λ is wavelength of ultra/mega sonic wave, and N is an integer number between 2 to 1000.

After chuck 5014 rotating N rotations, mega sonic device 5003 turns up to total angle of 0.5nλ/F, where n is an integer number starting from 1.

The rotation angle increment of motor 5009 for each rotation of wafer 5010 or chuck 5014 is, $$\Delta\beta=0.5\lambda/(LN) \quad (4)$$

Where, L is length of mega sonic device 5003, λ is wavelength of ultra/mega sonic wave, and N is an integer number between 2 to 1000.

After chuck 5014 rotating N rotations, mega sonic device 5003 turns up to total angle of 0.5nλ/F, where n is an integer number starting from 1.

Figure 7:
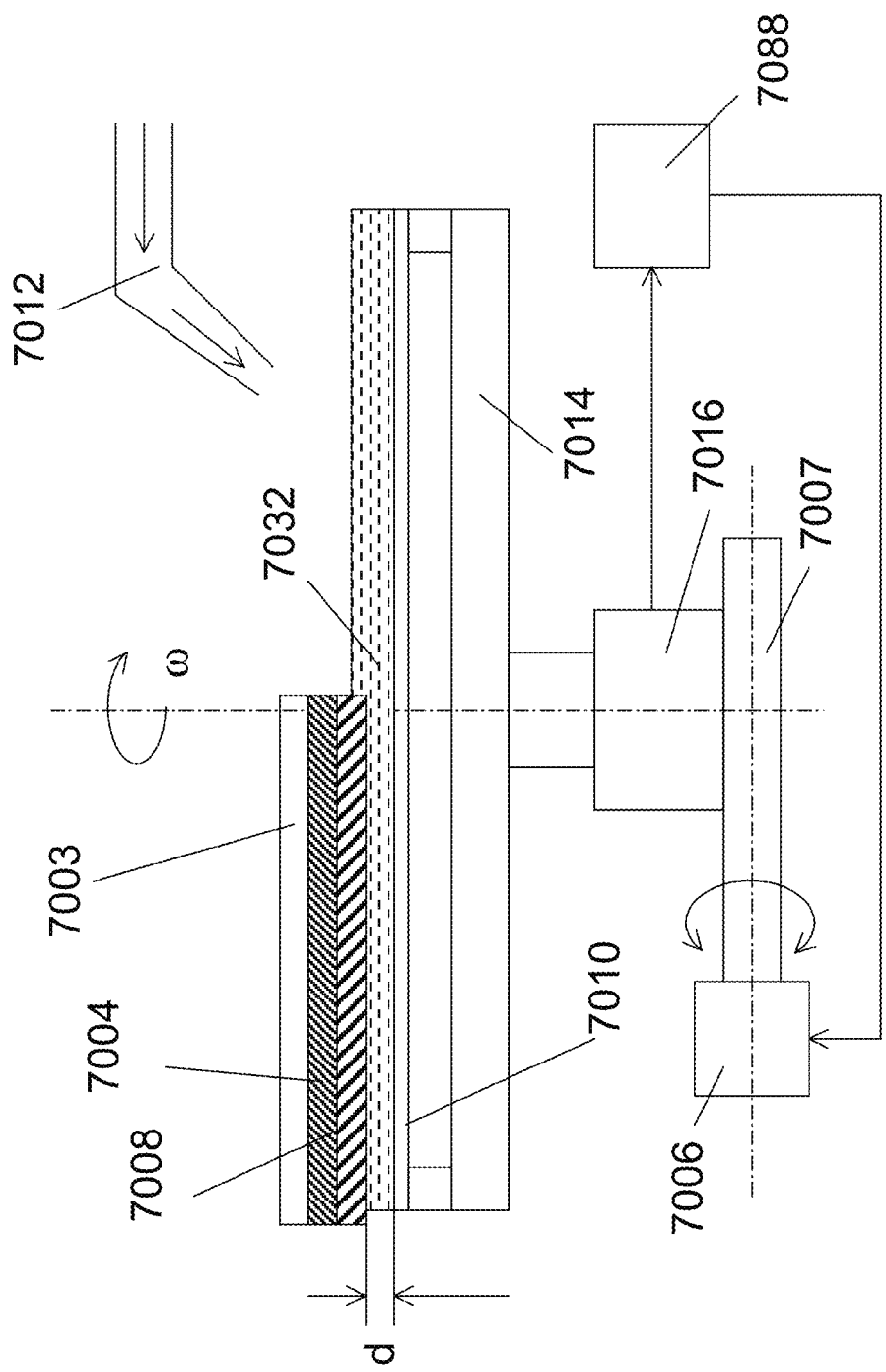
FIG. 7 depicts another exemplary wafer cleaning apparatus.

FIG. 7 shows another embodiment of wafer cleaning apparatus using a mega sonic device according to the present invention. The embodiment is similar to that shown in FIG. 4, except that chuck 7014 is turn clockwise and counter clockwise around axis 7007 by motor 7006 for each rotation of wafer 7010. More specifically speaking, control unit 7088 changes the gap d between mega sonic device 7003 and wafer 7010 by instruct motor 7006 to turn chuck 7014 around axis 7007 clockwise and counter clockwise.

Figure 8:
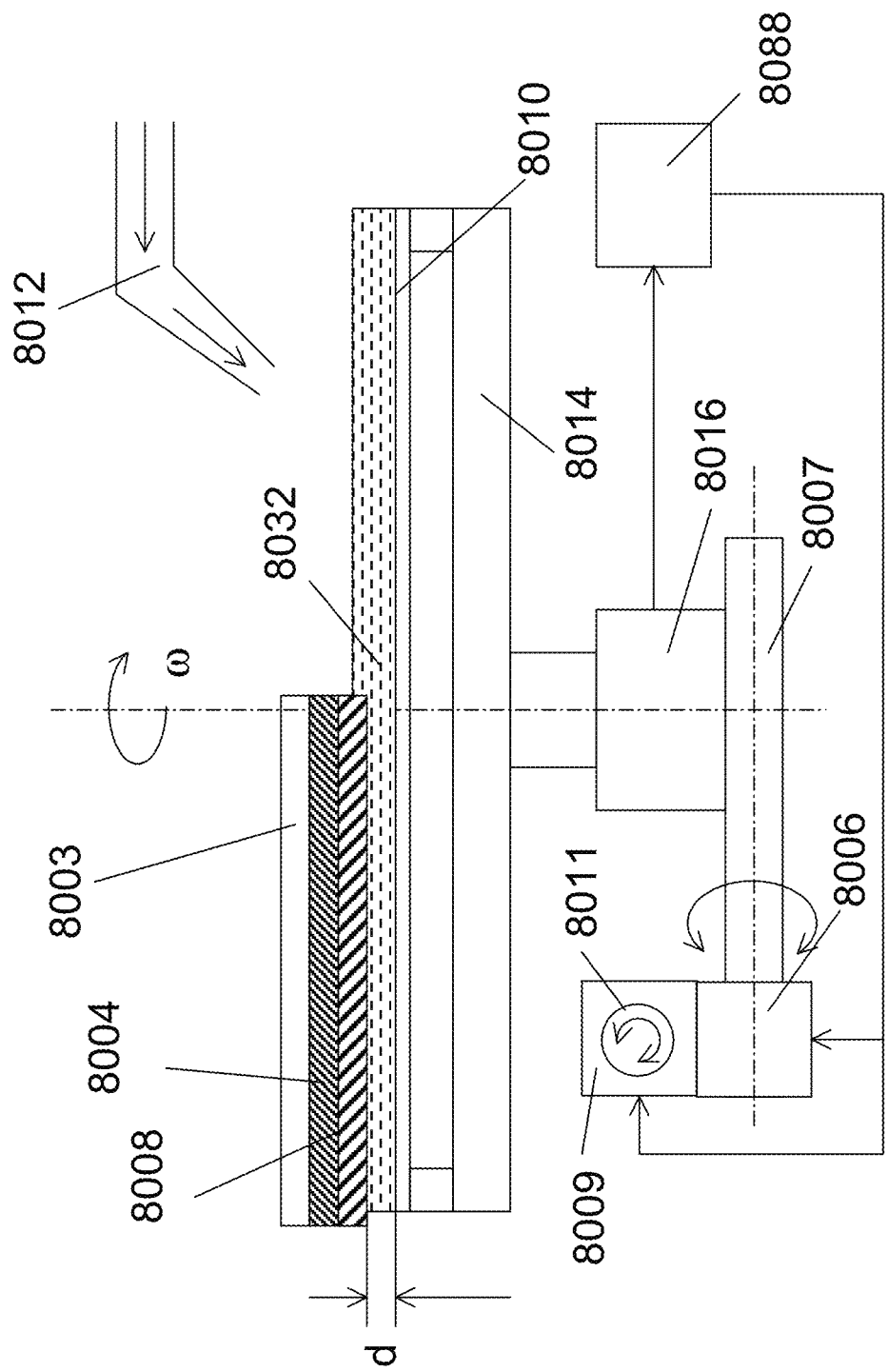
FIG. 8 depicts another exemplary wafer cleaning apparatus.

FIG. 8 shows another embodiment of wafer cleaning apparatus using a mega sonic device according to the present invention. The embodiment is similar to that shown in FIG. 7, except that another motor 8009 is added to turn chuck 8014 clockwise and counter clockwise around axis 8011 by for each rotation of wafer 8010. More specifically speaking, control unit 8088 changes the gap d between mega sonic device 8003 and wafer 8010 by instructing motor 8006 and motor 8009 to turn chuck 8014 around axis 8007 and axis 8011 clockwise and counter clockwise.

Figure 9:
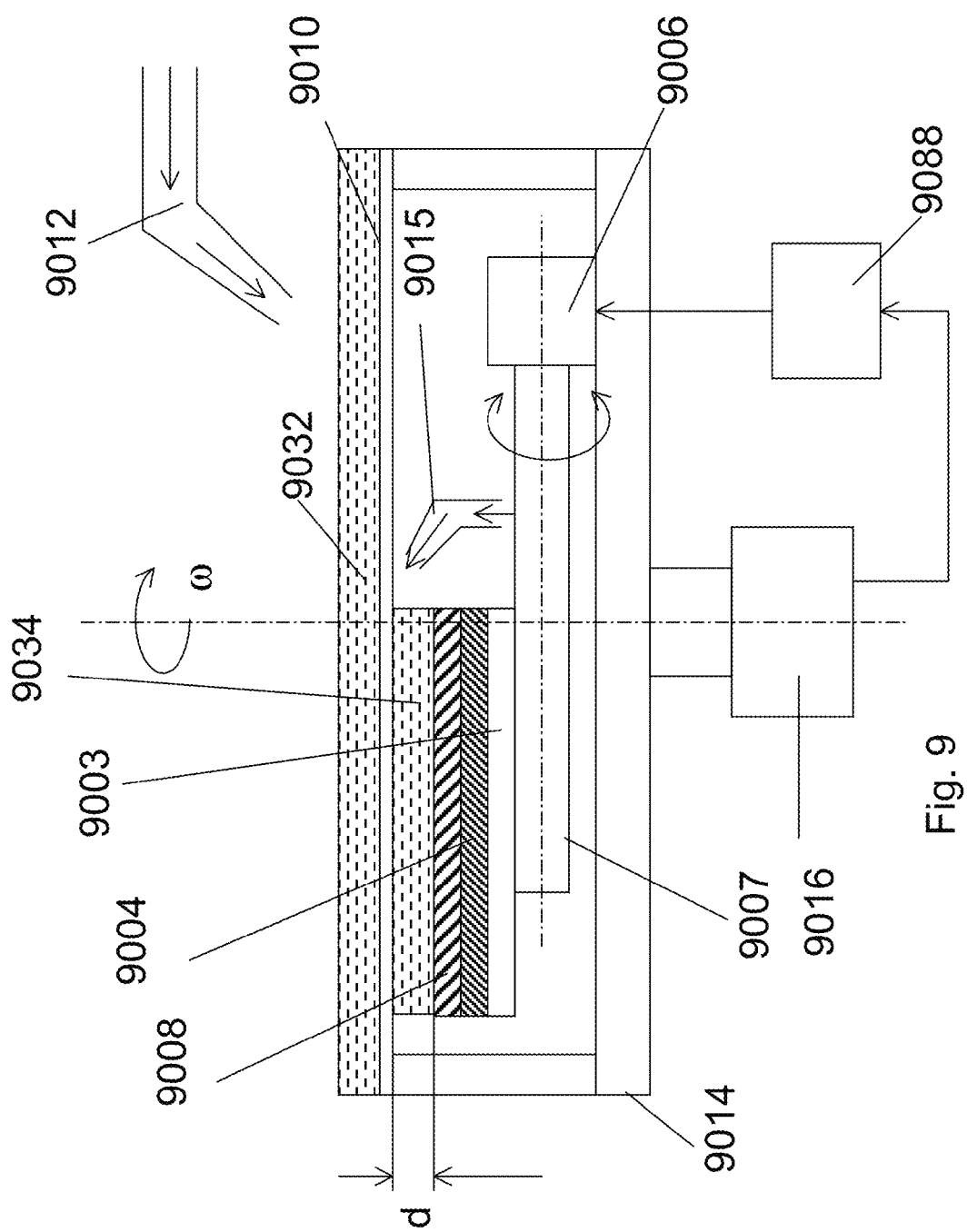
FIG. 9 depicts another exemplary wafer cleaning apparatus.

FIG. 9 shows another embodiment of wafer cleaning apparatus using a mega sonic device according to the present invention. The embodiment is similar to that shown in FIG. 4, except that mega sonic device 9003 is placed adjacently to the back side of wafer 9010, and is turn clockwise and counter clockwise around axis 9007 by motor 9006. Motor 9006 is attached to chuck 9014. Control unit 9088 changes the gap d between mega sonic device 9003 and back side of wafer 9010 by instructing motor 9006 to turn mega sonic device 9003 clockwise and counter clockwise around axis 9007. Mega sonic wave is transmitted to front side of wafer 9010 and water film 9032 through water film 9034 and wafer 9010. Nozzle 9015 supplies DI water or chemicals to maintain water film 9034 between mega sonic device 9003 and back side of wafer 9010. The advantage of this embodiment is to reduce or eliminate a possible damage caused by mega sonic wave to device structure on front side of wafer 9010.

Figure 10:
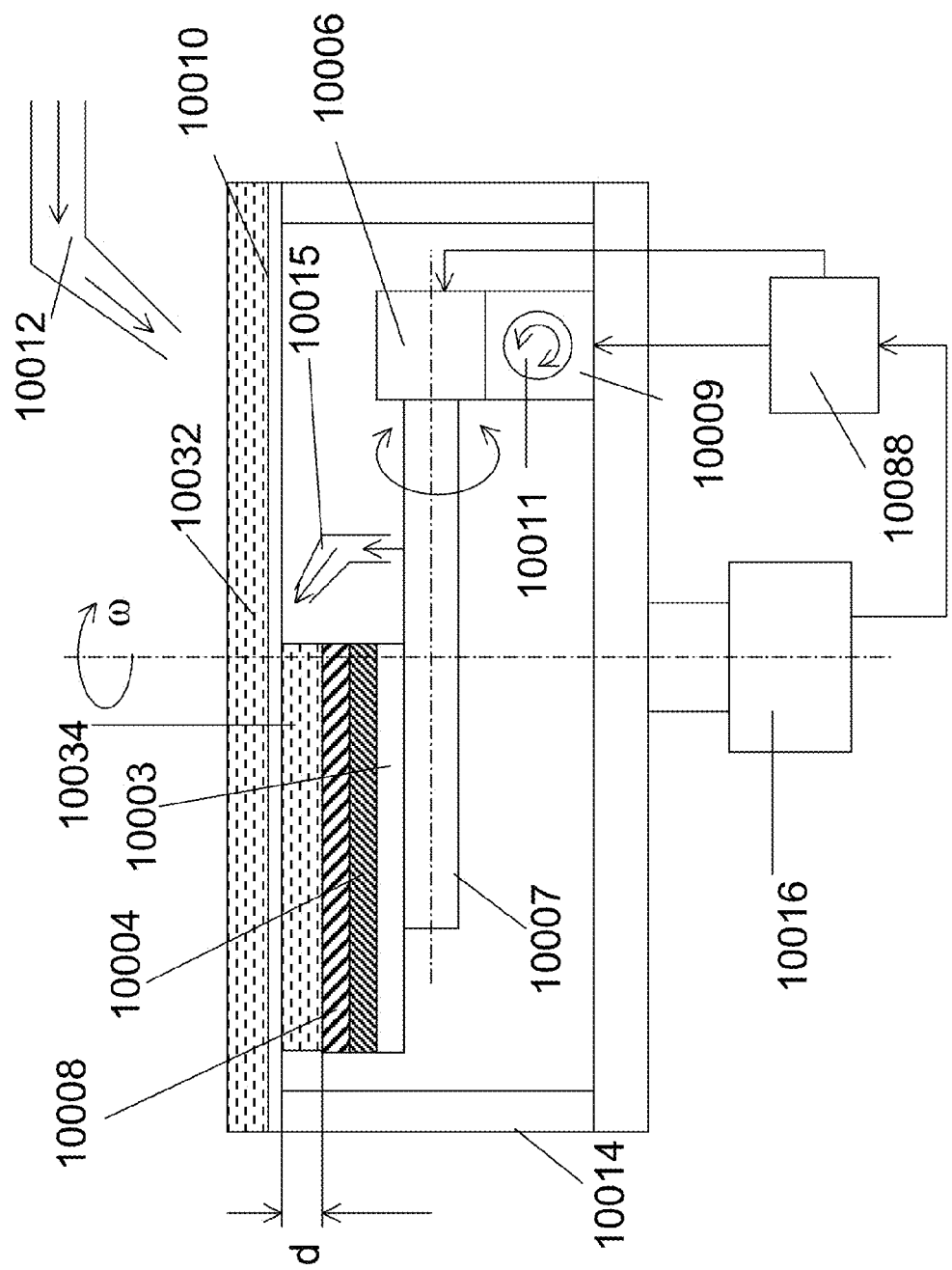
FIG. 10 depicts another exemplary wafer cleaning apparatus.

FIG. 10 shows another embodiment of wafer cleaning apparatus using a mega sonic device according to the present invention. The embodiment is similar to that shown in FIG. 9, except that another motor 10009 is added to turn chuck 10014 clockwise and counter clockwise around axis 10011 by for each rotation of wafer 10010. More specifically speaking, control unit 10088 changes the gap d between mega sonic device 10003 and wafer 10010 by instructing motor 10006 and motor 10009 to turn chuck 10014 around axis 10007 and axis 10011 clockwise and counter clockwise simultaneously.

Figure 11:
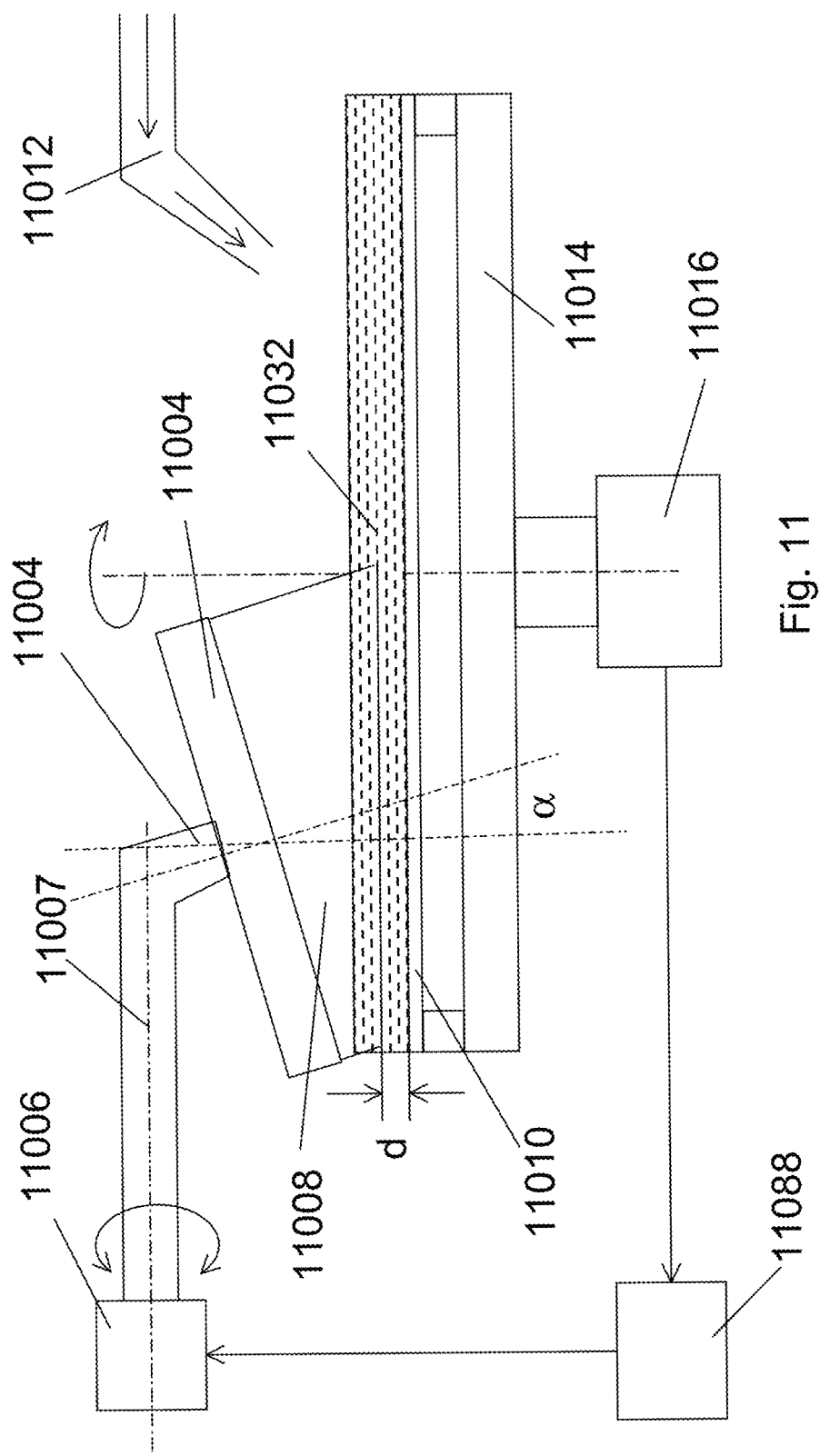
FIG. 11 depicts another exemplary wafer cleaning apparatus.

FIG. 11 shows another embodiment of wafer cleaning apparatus using a mega sonic device according to the present invention. The embodiment is similar to that shown in FIG. 4, except that surface of piezoelectric transducer 11004 has an angle α to surface of wafer 11010. Resonator 11008 is attached with piezoelectric transducer 11004, and mega sonic wave is transmitted to wafer through the resonator 11008 and DI water or chemical film 11032. Process sequence 1 and 2 described previously can be applied here.

Figure 12:
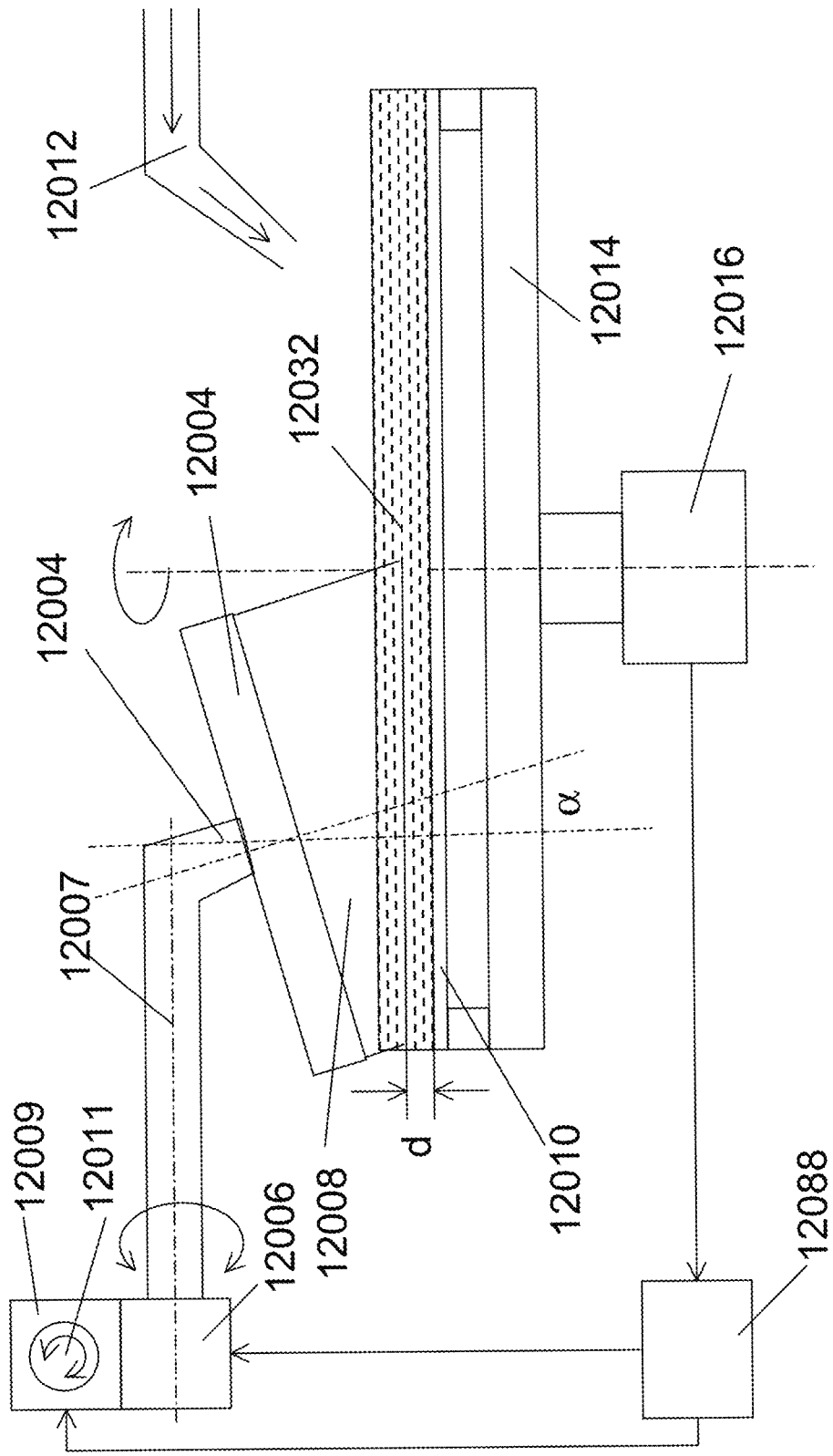
FIG. 12 depicts another exemplary wafer cleaning apparatus.

FIG. 12 shows another embodiment of wafer cleaning apparatus using a mega sonic device according to the present invention. The embodiment is similar to that shown in FIG. 11, except that additional rotating mechanism 12009 is added. Control unit 12088 changes the gap d between mega sonic resonator 12008 and wafer 12010 by instructing motor 12006 and motor 12009. More specifically speaking, for each rotation of wafer 12010 or chuck 12014, control unit 12088 instructs motor 12006 to turn mega sonic resonator 12008 clockwise and/or counter clockwise around axis 12007, and at the same time instructs motor 12009 to turn mega sonic resonator 12008 clockwise and/or counter clockwise around axis 12011.

Figure 13:
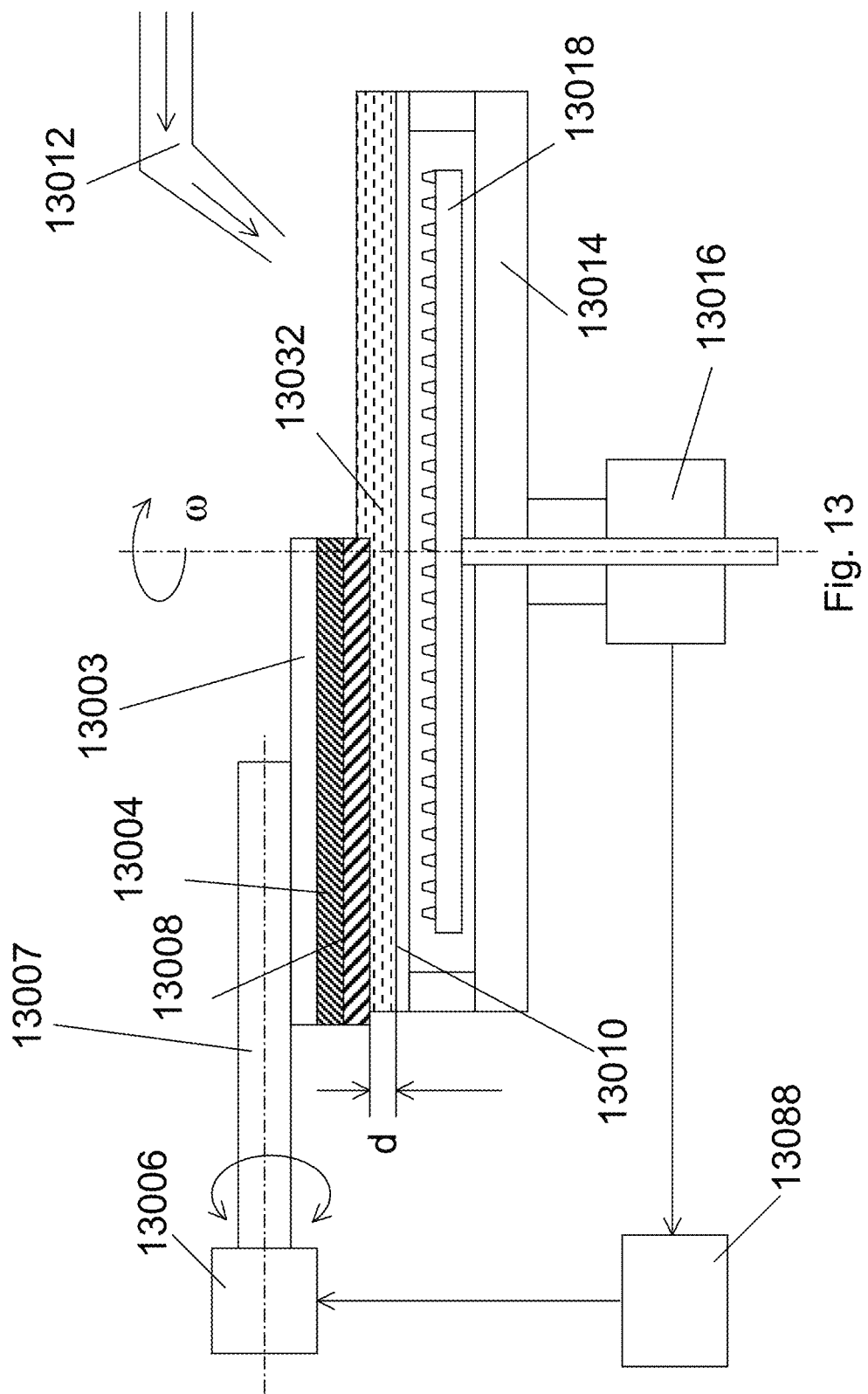
FIG. 13 depicts another exemplary wafer cleaning apparatus.

FIG. 13 shows another embodiment of wafer cleaning apparatus using a mega sonic device according to the present invention. The embodiment is similar to that shown in FIG. 4, except that wafer 13010 is placed face down, and a nozzle array 13018 is placed underneath of front side of wafer 13010. Mega sonic wave is transmitted to front side of wafer 13010 through water film 13032 and wafer 13010 itself. A nozzle array 13018 sprays liquid chemicals or DI water on to front side of wafer 13010.

Figure 14:
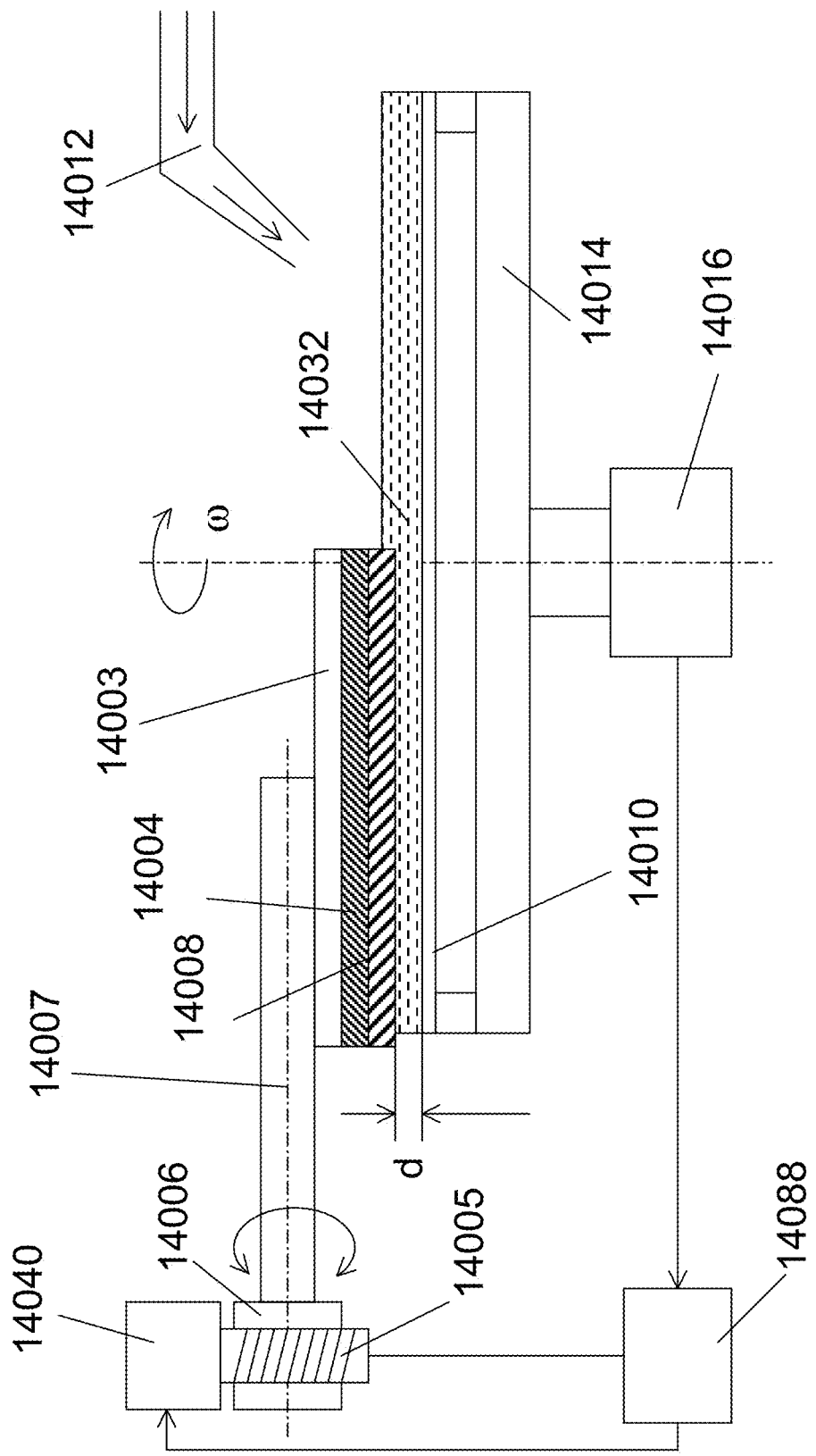
FIG. 14 depicts another exemplary wafer cleaning apparatus.

FIG. 14 shows another embodiment of wafer cleaning apparatus using a mega sonic device according to the present invention. The embodiment is similar to that shown in FIG. 4, except that additional motor 14040 and lead screw 14005 are added here. For each rotation of wafer 14010 or chuck 14014, control unit 14088 instructs motor 14006 to turn mega sonic device 14003 clockwise and/or counter clockwise around axis 14007, and at the same time instructs motor 14040 to move mega sonic device 14003 up and down. For each rotation of wafer 14010 or chuck 14014, motor 14040 move mega sonic device 14003 up or down:

$$\Delta z = 0.5\lambda/N \quad (5)$$

Where, $\lambda$ is wavelength of ultra/mega sonic wave, and N is an integer number between 2 to 1000.

After wafer 14010 or chuck 14014 rotating N rotations, mega sonic device 14003 moves up to 0.5n$\lambda$, where n is integer number starting from 1.

Figure 15C:
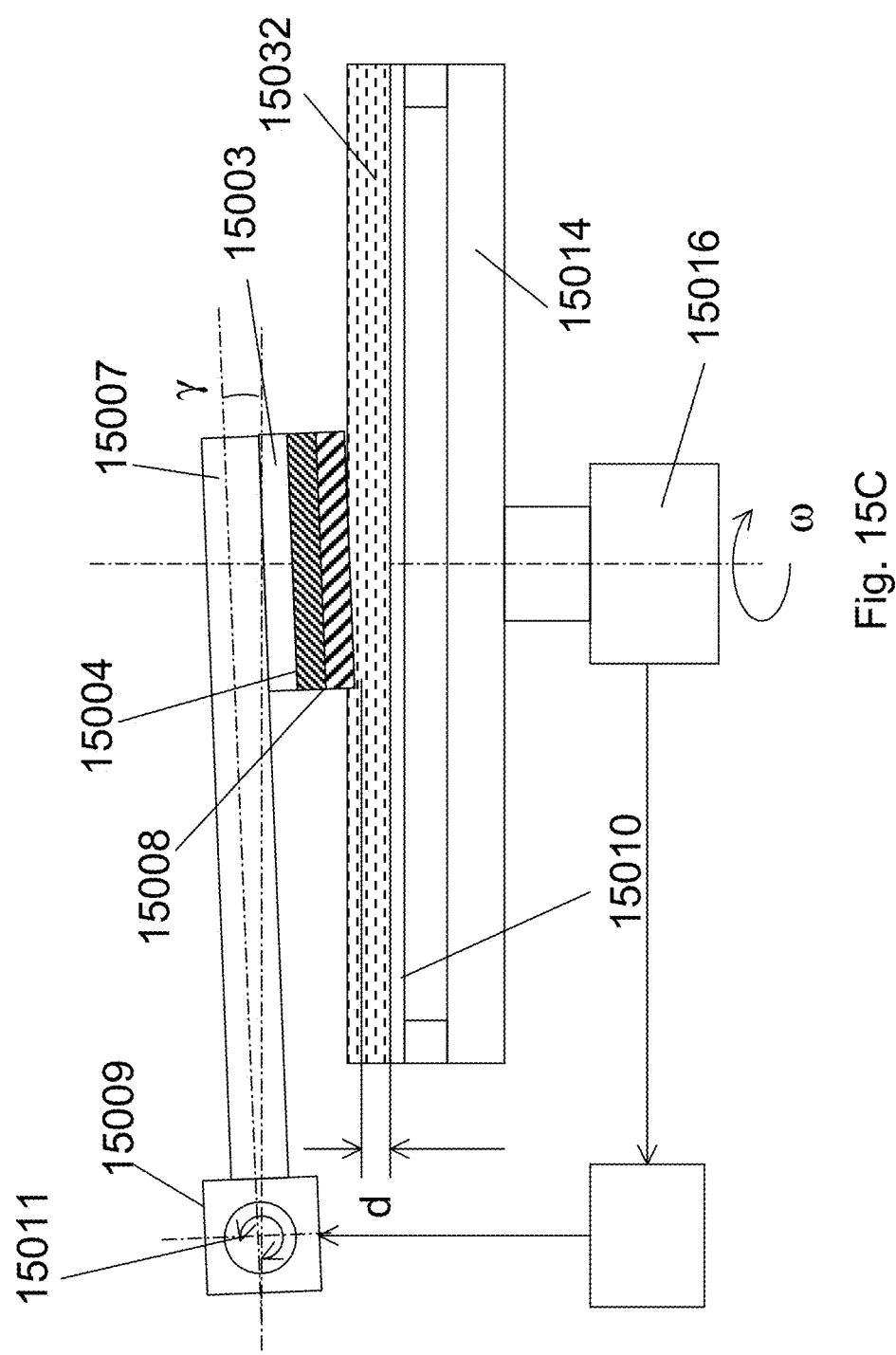

FIGS. 15A to 15C show another embodiment of wafer cleaning apparatus using a mega sonic device according to the present invention. The gap between mega sonic device 15003 and wafer 15010 is changed by motor 15006 as chuck 15014 rotating during cleaning process. Control unit 15088 is used to control the speed of motor 15006 based on speed of motor 15016. For each rotation of wafer 15010 or chuck 15014, control unit 15088 instructs motor 15006 to turn mega sonic device 15003 clockwise and/or counter clockwise around axis 15011. The increment of rotation angle of motor 15006 for each rotation of wafer 15010 or chuck 15014 is, $$\Delta \gamma = 0.5\lambda/(MN) \quad (6)$$

Where, M is distance between axis 15011 and middle position of mega sonic device 15003, $\lambda$ is wavelength of ultra/mega sonic wave, and N is an integer number between 2 to 1000.

After chuck 15014 rotating N rotations, mega sonic device 15003 turns up to total angle of 0.5n$\lambda$/M, where n is an integer number starting from 1.

FIG. 16A to 16 D show top view of mega sonic devices according to the present invention. Mega sonic device shown in FIG. 4 can be replaced by different shape of mega sonic devices 16003, i.e. triangle or pie shape as shown in FIG. 16A, rectangle as shown in FIG. 16 B, octagon as shown in FIG. 16C, elliptical as shown in FIG. 16 D, half cycle to cover half of wafer as shown in FIG. 16E, quarter cycle to cover a quarter of wafer as shown in FIG. 16F, and full cycle to cover entire wafer as shown in FIG. 16G. For the embodiment as shown in FIG. 16G, since the mega sonic device is covering entire wafer, the wafer or chuck do not need to rotate during the cleaning process. In other words, the gap between wafer and mega sonic device is varied as described in embodiments before, and wafer and chuck is kept no rotation.

According to an embodiment, a vertical distance between the ultra/mega sonic device and the semiconductor substrate or the wafer may be changed during the turning of the ultra/mega sonic device or the turning of the surface of the semiconductor substrate. The change of the vertical distance may be realized by moving the ultra/mega sonic device itself or moving the chuck. According to an embodiment, the semiconductor substrate rotates, for example, a chuck of the semiconductor substrate rotates together with the semiconductor substrate. And within each rotation of the chuck, the ultra/mega sonic device or the semiconductor substrate turns, and the vertical distance between the ultra/mega sonic device and the semiconductor substrate changes. Therefore, a better uniformity of mega sonic power density distribution is implemented.

Although the present invention has been described with respect to certain embodiments, examples, and applications, it will be apparent to those skilled in the art that various modifications and changes may be made without departing from the invention.

What is claimed is:

1. A method for cleaning semiconductor substrate using ultra/mega sonic device, comprising:
   holding a semiconductor substrate by using a chuck;
   positioning a ultra/mega sonic device adjacent to the semiconductor substrate;
   injecting a chemical liquid on the semiconductor substrate and into a gap between the semiconductor substrate and the ultra/mega sonic device by using at least one nozzle;
   changing the gap between the semiconductor substrate and the ultra/mega sonic device by changing angle between the semiconductor substrate and the ultra/mega sonic device, wherein the gap between the semiconductor substrate and the ultra/mega sonic device changes for each rotation of the semiconductor substrate; wherein the angle is changed by turning the ultra/mega sonic device clockwise and/or counter clockwise around an axis parallel to the semiconductor substrate, or the angle is changed by turning the semiconductor substrate clockwise and/or counter clockwise around an axis parallel to a surface of the ultra/mega sonic device through a control unit and a driving mechanism.

2. The method of claim 1, wherein the ultra/mega sonic device is positioned adjacent to a front side of the semiconductor substrate; and
   the gap is changed by turning mega sonic device clockwise and/or counter clockwise around an axis parallel to the front side of the semiconductor substrate.

3. The method of claim 2, wherein further comprises:
   rotating the chuck around an axis vertical to surface of the semiconductor wafer, and changing the gap between the semiconductor substrate and the ultra/mega sonic device for each rotation of the chuck.

4. The method of claim 2, wherein further comprises:
moving the ultra/mega sonic device in a direction vertical to the surface of semiconductor substrate, or moving the chuck in a direction vertical to the surface of ultra/mega sonic device.

5. The method of claim 1, wherein the ultra/mega sonic device is positioned adjacent to a back side of the semiconductor substrate; and
the gap is changed by turning mega sonic device clockwise and/or counter clockwise around an axis parallel to the back side of the semiconductor substrate.

6. The method of claim 5, wherein further comprises:
rotating the chuck around an axis vertical to surface of the semiconductor wafer, and changing the gap between the semiconductor substrate and the ultra/mega sonic device for each rotation of the chuck.

7. The method of claim 5, wherein further comprises:
moving the ultra/mega sonic device in a direction vertical to the surface of the semiconductor substrate, or moving the chuck in a direction vertical to the surface of the ultra/mega sonic device.

8. The method of claim 1, wherein the ultra/mega sonic device is positioned adjacent to a front side of the semiconductor substrate; and
the gap is changed by turning the front side of the semiconductor substrate clockwise and/or counter clockwise around an axis parallel to the surface of the mega sonic device.

9. The method of claim 8, wherein further comprises:
rotating the chuck around an axis vertical to surface of the semiconductor wafer, and changing the gap between the semiconductor substrate and the ultra/mega sonic device for each rotation of the chuck.

10. The method of claim 8, wherein further comprises:
moving the ultra/mega sonic device in a direction vertical to the surface of the semiconductor substrate, or moving the chuck in a direction vertical to the surface of the ultra/mega sonic device.

11. The method of claim 1, wherein the ultra/mega sonic device is positioned adjacent to a back side of the semiconductor substrate; and
the gap is changed by turning the semiconductor substrate clockwise and/or counter clockwise around an axis parallel to the surface of the mega sonic device.

12. The method of claim 11, wherein further comprises:
rotating the chuck around an axis vertical to surface of the semiconductor wafer, and changing the gap between the semiconductor substrate and the ultra/mega sonic device for each rotation of the chuck.

13. The method of claim 11, wherein further comprises:
moving the ultra/mega sonic device in a direction vertical to the surface of the semiconductor substrate, or moving the chuck in a direction vertical to the surface of the ultra/mega sonic device.

14. The method of claim 1, wherein the chuck is kept no rotation during cleaning process.

* * * * *